US012293923B2

(12) United States Patent
Son

(10) Patent No.: US 12,293,923 B2
(45) Date of Patent: May 6, 2025

(54) METHOD OF FABRICATING SEMICONDUCTOR DEVICE

(71) Applicant: Samsung Electronics Co., Ltd., Suwon-si (KR)

(72) Inventor: Yangsoo Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 473 days.

(21) Appl. No.: 17/726,673

(22) Filed: Apr. 22, 2022

(65) Prior Publication Data

US 2023/0075390 A1    Mar. 9, 2023

(30) Foreign Application Priority Data

Sep. 9, 2021    (KR) .......................... 10-2021-0120349

(51) Int. Cl.
*H01L 21/32*     (2006.01)
*H01L 21/3105*   (2006.01)
*H01L 21/47*     (2006.01)

(52) U.S. Cl.
CPC ........ *H01L 21/32* (2013.01); *H01L 21/31053* (2013.01); *H01L 21/47* (2013.01)

(58) Field of Classification Search
CPC .... H01L 21/32; H01L 21/31053; H01L 21/47
See application file for complete search history.

(56) References Cited

U.S. PATENT DOCUMENTS

| | | |
|---|---|---|
| 8,216,938 B2 | 7/2012 | Lee et al. |
| 10,170,306 B2 | 1/2019 | Lee et al. |
| 10,192,780 B1 | 1/2019 | Wang et al. |
| 10,249,496 B2 | 4/2019 | Shu et al. |
| 10,395,926 B1 | 8/2019 | Tang et al. |
| 10,692,812 B2 | 6/2020 | Srivastava et al. |
| 10,818,494 B2 | 10/2020 | Chen et al. |
| 10,937,653 B2 | 3/2021 | Chen et al. |
| 10,957,583 B2 | 3/2021 | Burns et al. |
| 11,037,789 B2 * | 6/2021 | Huang ................ H01L 21/0332 |
| 2015/0200096 A1 | 7/2015 | Huang et al. |
| 2016/0276154 A1 | 9/2016 | Huang et al. |
| 2017/0365472 A1 | 12/2017 | Huang et al. |
| 2020/0111670 A1 | 4/2020 | Huang et al. |
| 2022/0301927 A1 * | 9/2022 | Huang ................ H01L 21/0337 |
| 2023/0314952 A1 * | 10/2023 | Gabor ................ H01L 21/76816 |
| | | 430/208 |

* cited by examiner

*Primary Examiner* — Victor A Mandala
*Assistant Examiner* — Colleen E Snow
(74) *Attorney, Agent, or Firm* — Harness, Dickey & Pierce, P.L.C.

(57) ABSTRACT

A method of fabricating a semiconductor device includes forming a cut-off region in at least one mandrel line among a plurality of mandrel lines, conformally forming a spacer material layer in the plurality of mandrel lines and a non-mandrel area and forming a cut spacer in the cut-off region and depositing a gap-fill material such that a cut block is formed on a portion of the non-mandrel area and a concave portion of the cut spacer is filled.

20 Claims, 39 Drawing Sheets

METHOD OF FABRICATING SEMICONDUCTOR DEVICE

CROSS-REFERENCE TO RELATED APPLICATION(S)

This application claims the benefit under 35 USC 119(a) of Korean Patent Application No. 10-2021-0120349 filed on Sep. 9, 2021 in the Korean Intellectual Property Office, the entire disclosure of which is incorporated herein by reference for all purposes.

BACKGROUND

The present inventive concepts relate to a method of fabricating a semiconductor device.

Various self-aligned patterning such as double or quadruple patterning have been extensively developed and researched as methods of implementing a high resolution of a fine pattern in a semiconductor process. The self-aligned patterning process may be used, for example, in a fine pattern forming process and a wiring line process such as a back end of line (BEOL).

According to the recent demand for spacing reduction, a defect in the cut-off process introduced for line separation in the self-aligned patterning process has occurred and has been the cause of an undesirable short circuit between wiring lines in a subsequent process.

SUMMARY

Example embodiments provide a method of fabricating a semiconductor device using a self-aligned patterning process having improved reliability of a cut-off process.

According to some example embodiments, a method of fabricating a semiconductor device includes forming a hard mask layer on a target layer; forming, on the hard mask layer, a plurality of mandrel lines each having sidewalls extending in a first direction and arranged in a second direction intersecting the first direction such that the plurality of mandrel lines define a non-mandrel area; forming a cut-off region in at least one of the plurality of mandrel lines; forming a spacer material layer such that the spacer material layer is conformally formed on the plurality of mandrel lines and the non-mandrel area and the spacer material layer includes a cut spacer in the cut-off region; depositing a gap-fill material such that the gap-fill material is formed on the cut spacer and the gap-fill material includes a cut block on a portion of the non-mandrel area; etching back the spacer material layer such that sidewall spacers are formed on the sidewalls of the plurality of mandrel lines and a region, except for the cut block, of upper surfaces of the plurality of mandrel lines and the non-mandrel area is exposed; selectively removing the plurality of mandrel lines from the sidewall spacers; using the cut spacer, the cut block, and the sidewall spacers to form a mask pattern by etching the hard mask layer; and etching the target layer using the mask pattern.

According to some example embodiments, a method of fabricating a semiconductor device includes forming a dielectric layer on a substrate; forming a hard mask layer on the dielectric layer; forming a plurality of mandrel lines on the hard mask layer such that the plurality of mandrel lines define a non-mandrel area; forming a cut-off region in at least one of the plurality of mandrel lines forming a spacer material layer such that the spacer material layer is conformally formed on the plurality of mandrel lines and in the non-mandrel area, and the spacer material layer includes a cut spacer having a concave portion in the cut-off region; depositing a gap-fill material such that the gap-fill material fills the concave portion of the cut spacer and the gap-fill material includes a cut block on a portion of the non-mandrel area; etching back the spacer material layer such that sidewall spacers are formed on sidewalls of the plurality of mandrel lines, and a region, except for the cut block, of upper surfaces of the plurality of mandrel lines and the non-mandrel area is exposed; selectively removing the plurality of mandrel lines from the sidewall spacers; using the cut spacer, the cut block, and the sidewall spacers to form a mask pattern by etching the hard mask layer; forming a plurality of trenches in the dielectric layer using the mask pattern; and filling the plurality of trenches with a conductive material such that a plurality of wiring lines is formed in the plurality of trenches.

According to some example embodiments, a method of fabricating a semiconductor device includes forming a hard mask layer on a target layer; forming, on the hard mask layer, a plurality of mandrel lines each having sidewalls extending in a first direction and arranged in a second direction intersecting the first direction such that the plurality of mandrel lines define a non-mandrel area; forming a cut-off region in at least of the plurality of mandrel lines; forming a spacer material layer such that the spacer material layer is conformally formed on the plurality of mandrel lines and the non-mandrel area and the spacer material layer includes a cut spacer having a concave portion in the cut-off region; depositing a gap-fill material such that the gap-fill material fills the concave portion of the cut spacer, and the gap-fill material includes a cut block on a portion of the non-mandrel area, the cut block positioned adjacent to the cut spacer in the second direction; etching back the spacer material layer such that sidewall spacers are formed on the sidewalls of the plurality of mandrel lines, respectively; using the cut spacer, the cut block, and the sidewall spacers to form a mask pattern by etching the hard mask layer; and etching the target layer using the mask pattern.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 2A to 4A are plan views illustrating some processes (mandrel line formation) of a method of fabricating a semiconductor device according to some example embodiments;

FIGS. 2B to 4B are cross-sectional views taken along line I1-I1' of a plane of FIGS. 2A to 4A, respectively;

FIGS. 5A to 7A are plan views illustrating some processes (forming a cut-off region) of a method of fabricating a semiconductor device according to an example embodiment;

FIGS. 5B to 7B are cross-sectional views taken along line I1-I1' of a plane of FIGS. 5A to 7A, and FIGS. 5C to 7C are cross-sectional views taken along line I2-I2' of a plane of FIGS. 5A to 7A, respectively;

FIGS. 8A to 11A are plan views illustrating some processes (forming cut spacers and cut blocks) of a method of fabricating a semiconductor device according to some example embodiments;

FIGS. 8B to 11B are cross-sectional views of a plane taken along line I1-I1' of FIGS. 8A to 11A, respectively, FIGS. 8C to 11C are cross-sectional views of a plane taken along line I2-I2' of FIGS. 8A to 11A, respectively, and FIGS. 8D to 11D are cross-sectional views taken along line II-II' in the plane of FIGS. 8A to 11A, respectively;

FIGS. 13A to 17A are plan views illustrating some processes (forming sidewall spacers and forming an upper mask pattern) of a method of fabricating a semiconductor device according to some example embodiments;

FIGS. 13B to 17B are cross-sectional views taken along line of a plane of FIGS. 13A to 17A, and FIGS. 13C to 17C are cross-sectional views taken along line I2-I2' of the plane of FIGS. 13A to 17A, respectively;

FIGS. 18A to 21A and 18B to 21B are cross-sectional views illustrating some processes (forming a lower mask pattern and wiring line) of a method of fabricating a semiconductor device according to some example embodiments, respectively, FIGS. 23A to 26A are plan views of a main process of a method of fabricating a semiconductor device according to some example embodiments, and FIGS. 23B to 26B are cross-sectional views of FIGS. 23A to 26A, respectively.

DETAILED DESCRIPTION

Hereinafter, various example embodiments will be described in detail with reference to the accompanying drawings.

Figure 1:
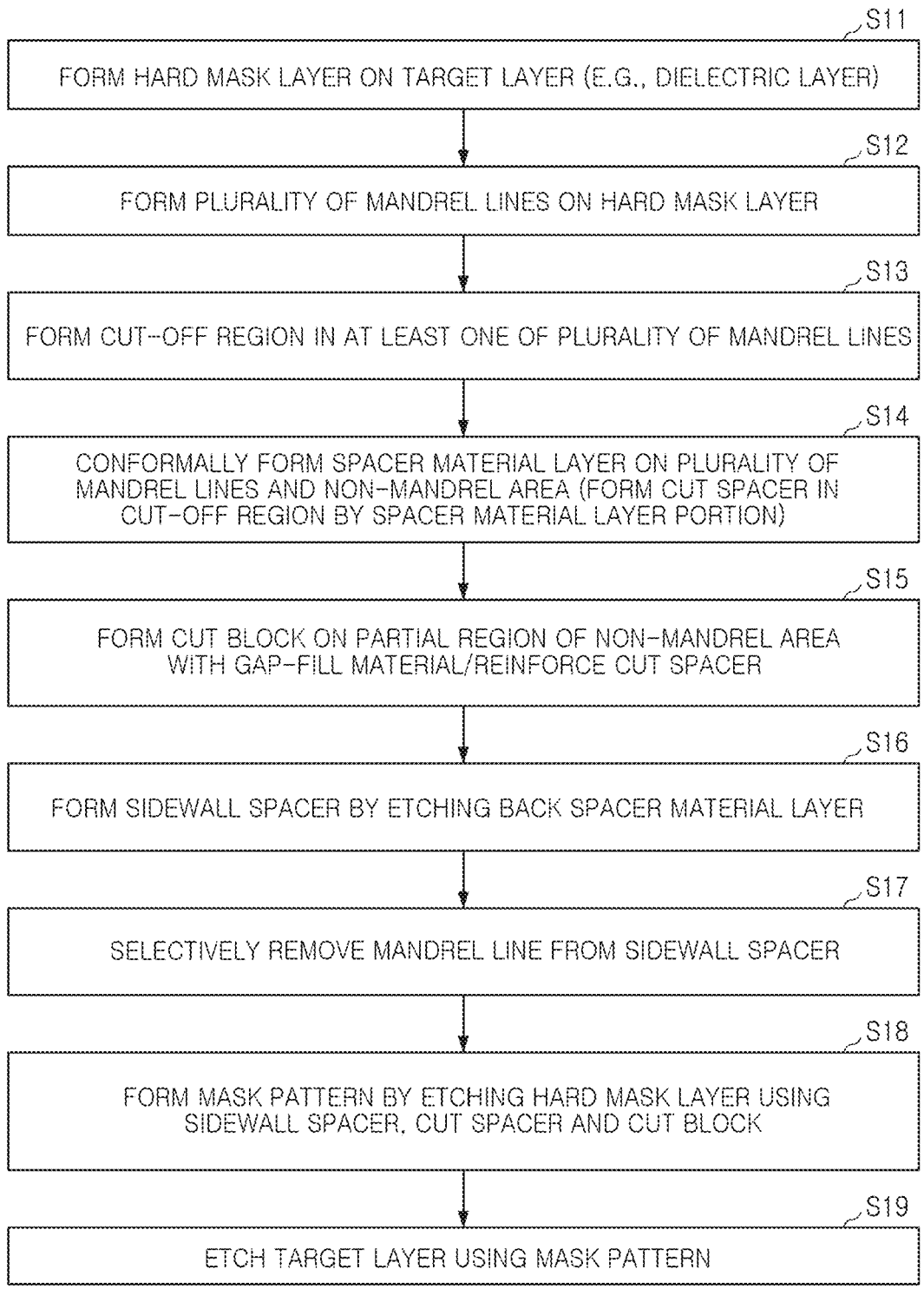
FIG. 1 is a flowchart illustrating a method of fabricating a semiconductor device according to some example embodiments.

FIG. 1 is a flowchart illustrating a method of fabricating a semiconductor device according to some example embodiments.

A method of fabricating a semiconductor device according to the example embodiments will be briefly described with reference to FIG. 1.

First, in a first operation (S11), a hard mask layer is formed on a target layer (e.g., a dielectric layer). The target layer may be a layer on which a fine pattern is to be formed (e.g., a dielectric layer and/or a semiconductor layer) through, e.g., etching. For example, the target layer may include a dielectric layer on which a wiring line, such as a back end of line (BEOL), is to be formed. The hard mask layer may have a mask pattern (e.g., formed in a subsequent self-aligned patterning process). For example, the hard mask layer may include first and second hard mask layers sequentially stacked on the target layer. The first and second hard mask layers may include different materials having etch selectivity (e.g., with respect to a subsequent etch process).

In a second operation (S12), a plurality of mandrel lines may be formed on the hard mask layer. An example of the second operation S12, according to some example embodiments, will be described below with reference to FIGS. 2A to 4.

The plurality of mandrel lines may be formed by depositing a mandrel layer on the hard mask layer and patterning the mandrel layer using, e.g., a photolithography process. In some example embodiments, the mandrel layer may be (and/or include) a material with etch selectivity in the patterning process compared to, e.g., one of the layers of the hard mask layer. For example, the mandrel layer may include amorphous silicon. The plurality of mandrel lines may be a structure having both sides extending in one direction. Each mandrel line defines an area in which a structure (e.g., a wiring line) is to be formed in a subsequent process. An area between the plurality of mandrel lines may be defined as a non-mandrel area. A region between sidewall spacers to be formed in a subsequent process among the non-mandrel areas may be a region in which a pattern (e.g., a wiring line) is to be formed in a subsequent process.

In a third operation (S13), a cut-off region may be formed in at least one mandrel line among the plurality of mandrel lines. An example of the third operation S13, according to some example embodiments, will be described below with reference to FIGS. 5A to 7C.

The cut-off region may be formed by removing a portion of the mandrel line. For example, one mandrel line extending in one direction may be divided into two or more lines by the cut-off region. This cut-off region may provide a space for separating a pattern to be formed in a subsequent process. In the case of a wiring line, two adjacent lines divided by the cut-off region may be electrically insulated by a dielectric layer.

In a fourth operation (S14), a spacer material layer may be conformally formed on the plurality of mandrel lines and the non-mandrel area. An example of the fourth operation S14, according to some example embodiments, will be described below with reference to see FIGS. 8A to 8D.

The spacer material layer may be formed on the surfaces of the plurality of mandrel lines, for example, on the upper surface and both side surfaces thereof, and in the non-mandrel area. For example, the spacer material layer may be conformally deposited using a process such as an atomic layer deposition (ALD) process. The spacer material layer may include an insulating material, for example, at least one of silicon oxide, silicon nitride, titanium oxide, titanium nitride, and/or boron nitride. The thickness of the spacer material layer may be proportional to the pitch (or width) of a final pattern.

In this operation (S14), a portion of the spacer material layer may be filled in the previously formed cut-off region to form a cut spacer (see FIGS. 8A to 8D and FIG. 12A).

There may be a critical dimension ("CD") limit (e.g., about 20 nm) of the cut-off region at the mandrel line, but since the thickness of the spacer material layer should also be reduced (e.g., to reduce the pitch of the final pattern) the cut-off region may not be completely filled by the spacer material layer. As a result, the cut spacer has a concave portion having a thin bottom portion, and a portion of the cut spacer (e.g., the bottom portion) is also removed in the etch-back process for formation of the sidewall spacer, which may cause pattern defects. However, the example embodiments provide a method of reinforcing the cut spacer in a subsequent cut block forming process (S15).

In a fifth operation (S15), a cut block may be formed on a portion of the non-mandrel area with a gap-fill material. An example of the fifth operation S15, according to some example embodiments, will be described below with reference to refer to FIGS. 9A to 11D and 12B.

In the process of forming the cut block, an imperfect portion, such as a concave portion, of the cut spacer may be reinforced with a gap-fill material (see FIG. 12B), which may be easily implemented by changing a photolithography process for the cut block and without an additional photolithography process. For example, this operation may be implemented by additionally forming an opening in which a cut spacer is exposed in addition to an opening in which a cut block is to be formed in a mask used for depositing the gap-fill material. Through reinforcement of the cut spacer, the incomplete cut spacer may be improved into a complete cut spacer in which the cut-off space is completely filled, and the cut spacer may be provided as a reliable structure for separating the final pattern together with the cut block.

In a sixth operation (S16), the spacer material layer is etched back to form sidewall spacers on respective sidewalls of the plurality of mandrel lines. An example of the fifth operation S15, according to some example embodiments, will be described below with reference to refer to FIGS. 13A to 14C.

In the etching back process for forming the sidewall spacers, a region of the non-mandrel area between the sidewall spacers on the hard mask layer, except for the cut block, may be exposed together with the upper surfaces of the plurality of mandrel lines. This etch-back process may be performed using an anisotropic RIE process.

In a seventh operation (S17), the mandrel lines are selectively removed from the sidewall spacers (refer to FIGS. 15A to 16C), and in an eighth operation (S18), the hard mask is etched using the sidewall spacers, the cut spacers, and the cut blocks, thereby forming a required mask pattern (see FIGS. 17A to 18B). Then, in a ninth operation (S19), the target layer may be etched using the mask pattern to form a final pattern (see FIG. 19). An example of the seventh operation S17, the eighth operation S18, and the ninth operation S19, according to some example embodiments, will be described below with reference to FIGS. 15A to 16C, 17A to 18B, and 19, respectively.

In some example embodiments, the sidewall spacers remaining on the respective sidewalls of the mandrel lines may be used as structures defining the spacing of the patterns. The region from which the mandrel line is removed, and the region between the sidewall spacers among the non-mandrel areas, may be provided as regions in which a final pattern is to be formed, respectively.

As described above, by reinforcing the spacer portion located in the cut-off region of the mandrel area in the process of forming the cut block in the non-mandrel area, the pattern to be formed in the subsequent process is stably separated to prevent unwanted pattern defects (e.g., short circuits in wiring lines).

Hereinafter, a method of fabricating a semiconductor device according to some example embodiments will be described in more detail with reference to FIGS. 2A to 22. The method of fabricating a semiconductor device illustrated in FIGS. 2A to 22 is illustrated, by way of example, as a process of forming a wiring structure (e.g., BEOL) using a dielectric layer as a target layer.

FIGS. 2A to 4A are plan views illustrating a mandrel line forming process in a method of fabricating a semiconductor device according to some example embodiments, and FIGS. 2B to 4B are cross-sectional views of FIGS. 2A to 4A, respectively.

Figure 2A:
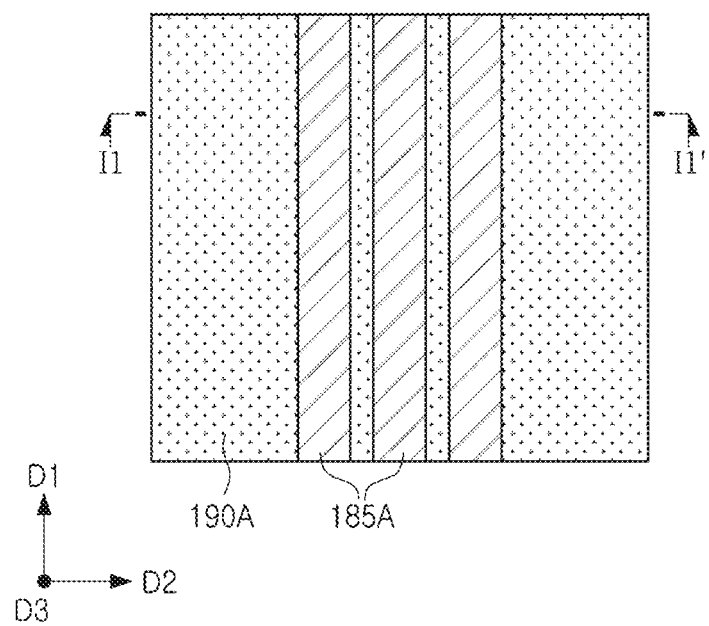
Figure 2B:
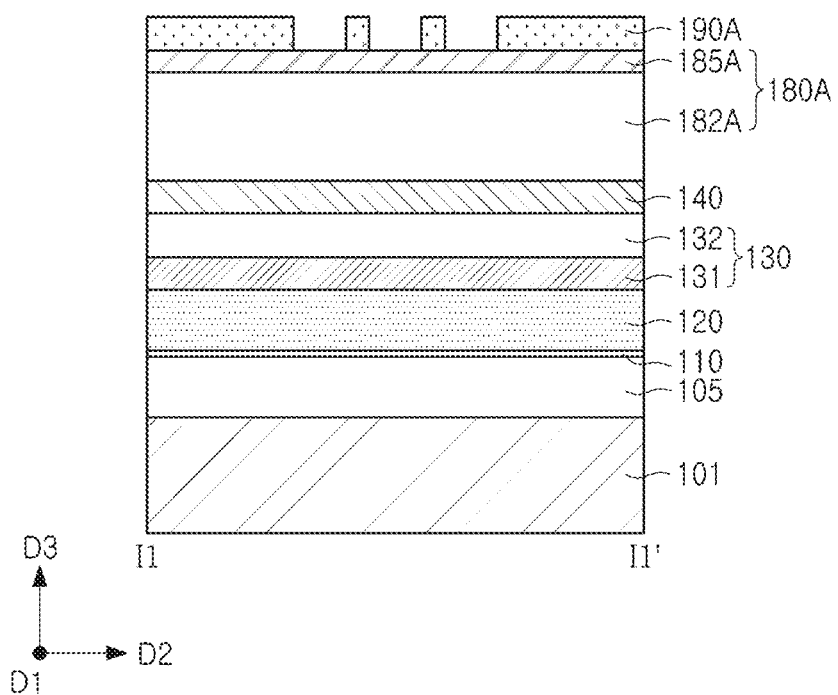

Referring to FIGS. 2A and 2B, a substrate 101 on which an interlayer insulating layer 105 is disposed is illustrated. A dielectric layer 120 for the formation of a wiring structure is formed on the interlayer insulating layer 105, and a hard mask layer 130, a mandrel layer 140, and a first mask stack 180A are sequentially stacked on the dielectric layer 120. A first mask stack 180A has a mask structure for patterning the mandrel layer 140, and a first photoresist pattern 190A is formed on the first mask stack 180A.

This process illustrates a process for forming a mandrel line ("140L" in FIGS. 4A and 4B) using a photolithography process. For example, after coating (e.g., spin coating) a photoresist material on the first mask structure 180A, the first photoresist pattern 190A is formed by, e.g., baking, exposure, and/or development processes. The first photoresist pattern 190A may use a positive tone resist having a positive tone development process or a negative tone development (NTD) process using a solvent-based developer. The exposure for forming the first photoresist pattern 190A may be performed by, for example, extreme ultraviolet (EUV) (e.g., 13.5 nm), but the exposure equipment is not limited thereto. For example, other exposure equipment such as an ArF excimer laser (193 nm) may be used. The first photoresist pattern 190A is patterned into an image corresponding to a mandrel line ("140L" in FIGS. 4A and 4B), and the first mask structure 180A may be patterned using the first photoresist pattern 190A.

The substrate 101 may be a semiconductor substrate and/or a multilayer substrate such as a silicon on insulator (SOI) substrate. The semiconductor substrate may include, for example, an elemental and/or a compound semiconductor such as silicon (Si), germanium (Ge), silicon germanium (SiGe), silicon carbide (SiC), gallium nitride (GaN), gallium arsenide (GaAs), and/or the like. The substrate 101 may be, for example, a semiconductor substrate doped with impurities to be p-type or n-type, and may include an active region in which devices, such as transistors, are formed. The interlayer insulating layer 105 may be disposed on the surface of the substrate 101 on which the active region is formed. The interlayer insulating layer 105 may include silicon oxide and/or a low-k material. For example, the low-k material may include a material with a dielectric constant ("k") less than or equal to silicon oxide, and may be, e.g., Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, combinations thereof, and/or the like.

The dielectric layer 120 may be provided as a region for forming a wiring line such as a BEOL, and the dielectric layer 120 may be formed on the interlayer insulating layer 105 with an etch stop layer 110 interposed therebetween. A wiring line to be formed on the dielectric layer 120 in a subsequent process may be electrically connected to the active region through a tack structure (not illustrated) located in the interlayer insulating layer 105. The dielectric layer 120 may include an insulating material such as tetraethyl ortho silicate (TEOS), silicon oxide ($SiO_2$), silicon oxynitride (SiON), nanoporous silica, hydrogensilsesquioxanes (HSQ), Teflon-AF (polytetrafluoroethylene or PTFE), silicon oxyfluoride (FSG), carbon-doped $SiO_2$ (SiCO), hydrogenated silicon oxycarbide (SiCOH), low-k materials, ultra-low-k (ULK) (e.g., a dielectric constant of 25 or less) dielectric materials, combinations thereof, and/or the like.

The hard mask layer 130 may include first and second hard mask layers 131 and 132 sequentially stacked on the dielectric layer 120. The first and second hard mask layers 131 and 132 may include different materials having etch with regards to a subsequent etch process. For example, the first hard mask layer 131 may include a metal compound suitable for a hard mask (such as titanium nitride), and the second hard mask layer 132 may include a dielectric material such as silicon oxide, silicon oxynitride, silicon nitride, and/or the like.

The mandrel layer 140 may include a material having a relatively high etch selectivity with respect to the second hard mask layer 132 disposed therebelow. For example, the mandrel layer 140 may include amorphous silicon. The first and second hard mask layers 131 and 132 and the mandrel layer 140 may be formed by various deposition processes such as physical vapor deposition (PVD), chemical vapor deposition (CVD), atomic layer deposition (ALD), and/or the like.

The first mask structure 180A may include a first hard mask layer 182A and a first anti-reflection layer 185A sequentially formed on the mandrel layer 140. For example, the first hard mask layer 182A may include a carbon-containing layer such as a spin on hard mask (SOH), silicon oxide, silicon oxynitride, silicon nitride, and/or the like, and similarly to the hard mask layer 130, may be formed of two layers of different materials. For example, the first anti-reflection layer 185A may include a material with low reflectivity and/or with good optical absorption, such as titanium, titanium dioxide, titanium nitride, chromium oxide, carbon, silicon nitride, silicon oxynitride, amorphous silicon, and/or the like.

Figure 3A:
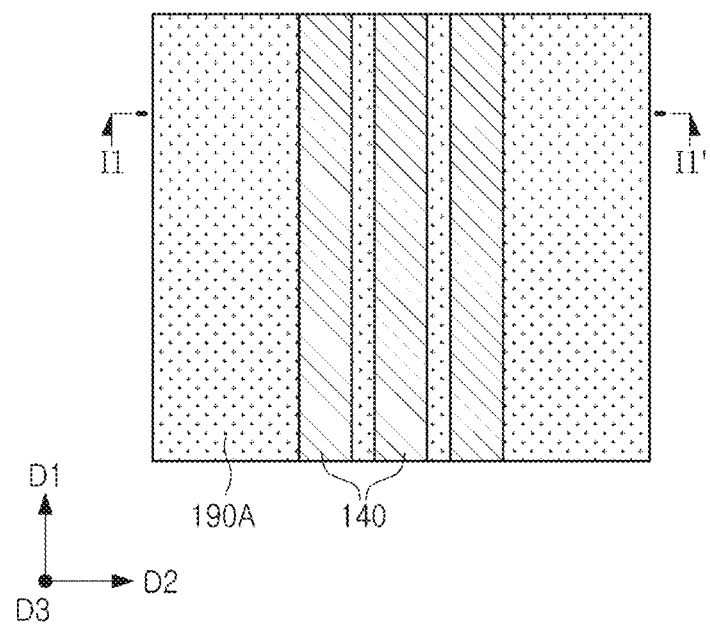
Figure 3B:
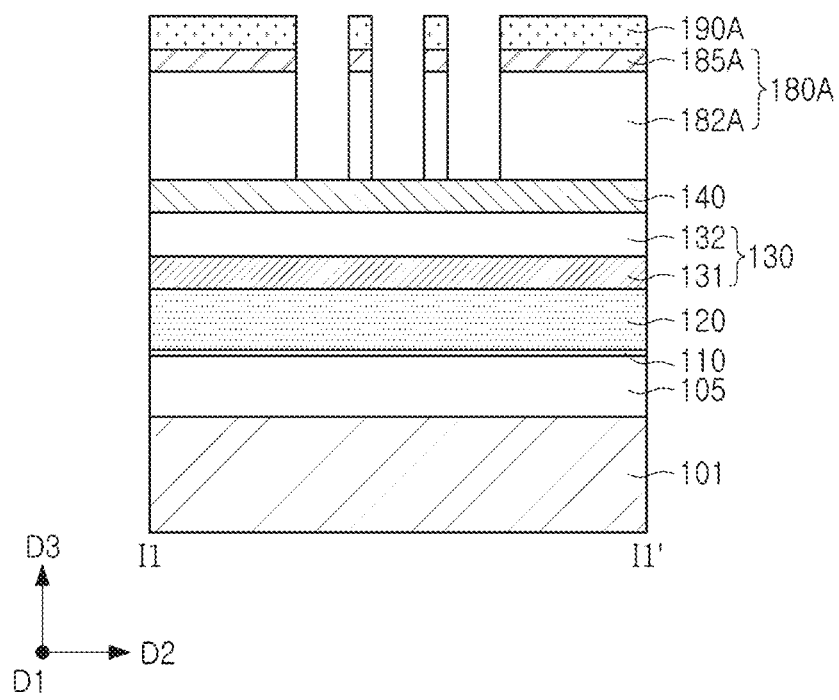
Figure 4A:
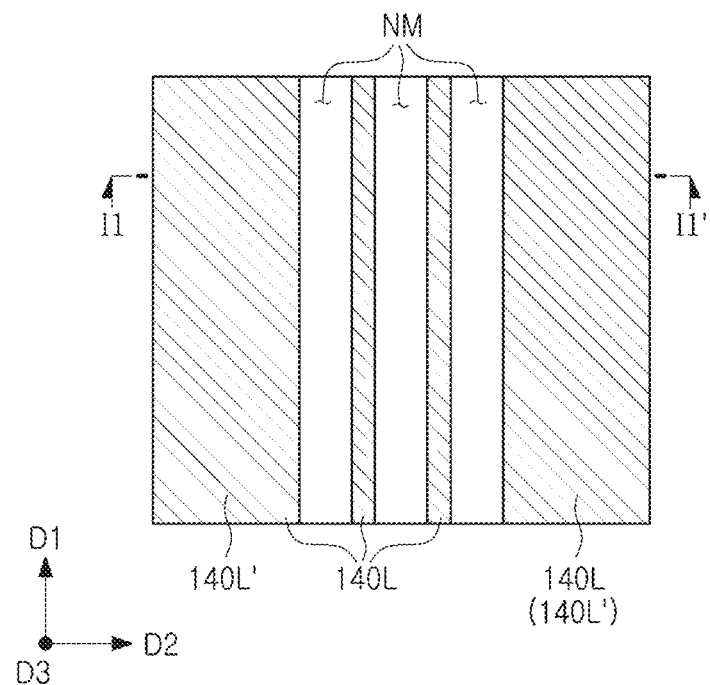
Figure 4B:
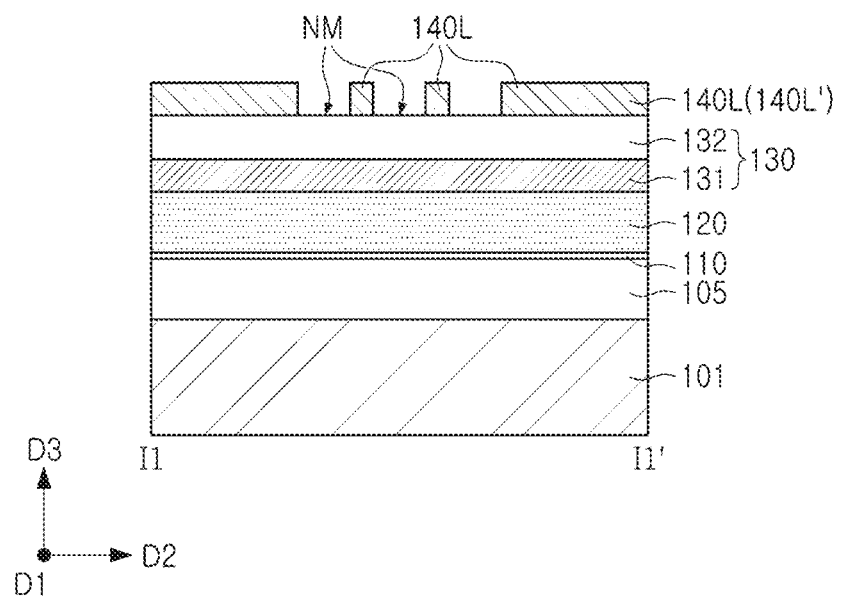

Referring to FIGS. 3A and 3B, the first mask stack 180A is patterned using the first photoresist pattern 190A, and then, referring to FIGS. 4A and 4B, a plurality of mandrel lines 140L are formed from the mandrel layer 140 using the first mask stack 180A, and the first mask stack 180A is removed.

First, the first photoresist pattern 190A is transferred to the first mask stack 180A to form a pattern for the plurality of mandrel lines 140L, and the plurality of mandrel lines 140L may be formed by patterning the mandrel layer 140 using the patterned first mask stack 180A. The etching process may be performed by, for example, an anisotropic process such as reactive ion etching (RIE).

The plurality of mandrel lines 140L may extend in a first direction D1 and may be arranged to be spaced apart from each other in a second direction D2 (wherein the second direction D2 intersects the first direction D1). In addition, the plurality of mandrel lines 140L may have sidewalls 140S extending in the first direction D1. For example, the plurality of mandrel lines 140L may include a peripheral mandrel area 140L' constituting a peripheral circuit in addition to the mandrel lines 140L. The wiring lines (Ma and Mb in FIG. 22) constituting the peripheral circuit may have a relatively large size, and thus, are not formed by the self-aligned patterning process and may be formed by a general photolithography process (the patterning of 140L' in FIGS. 15 and 16).

In addition, the surface of the hard mask layer 130 is exposed between the plurality of mandrel lines 140L, and the exposed area between the plurality of mandrel lines 140L may be defined as a non-mandrel area NM. The non-mandrel area NM may also include a region in which a wiring line is to be formed.

As illustrated in FIGS. 4A and 4B, after forming the plurality of mandrel lines 140L, a cut-off region of the mandrel lines 140L is formed.

FIGS. 5A to 7A are plan views illustrating a cut-off region forming process of a method of fabricating a semiconductor device according to some example embodiments, FIGS. 5B to 7B are cross-sectional views taken along lines I1-I1' of planes of FIGS. 5A to 7A, respectively, and FIGS. 5C to 7C are cross-sectional views taken along lines I2-I2' of planes of FIGS. 5A to 7A, respectively.

Figure 5A:
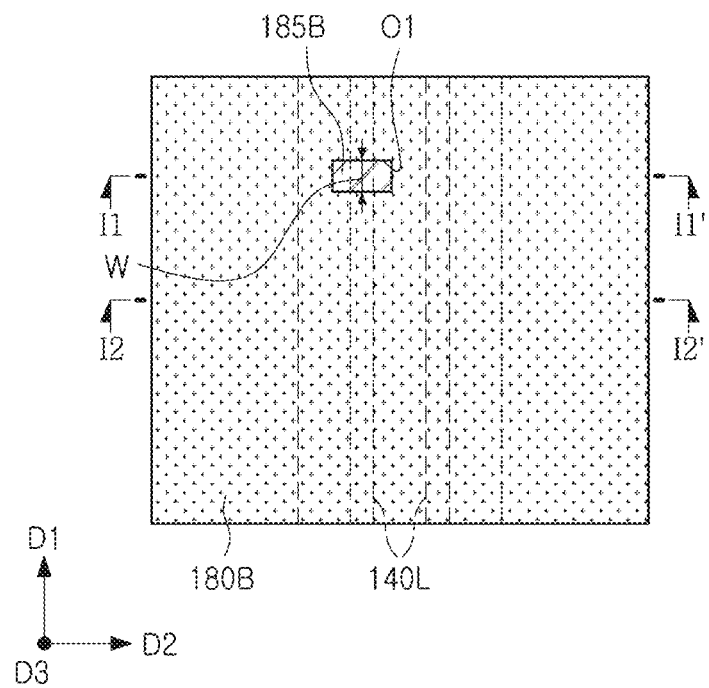
Figure 5B:
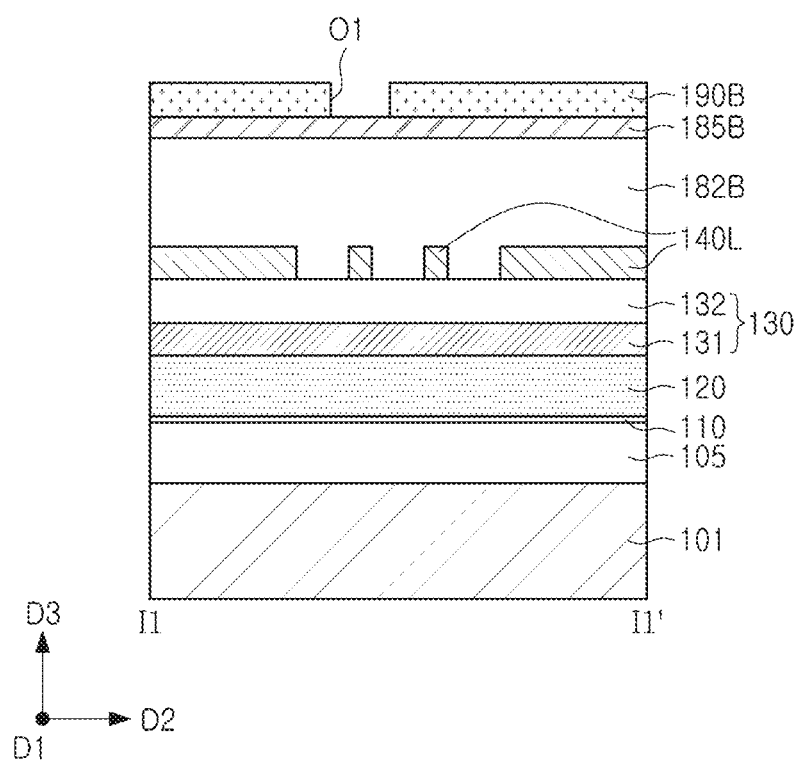
Figure 5C:
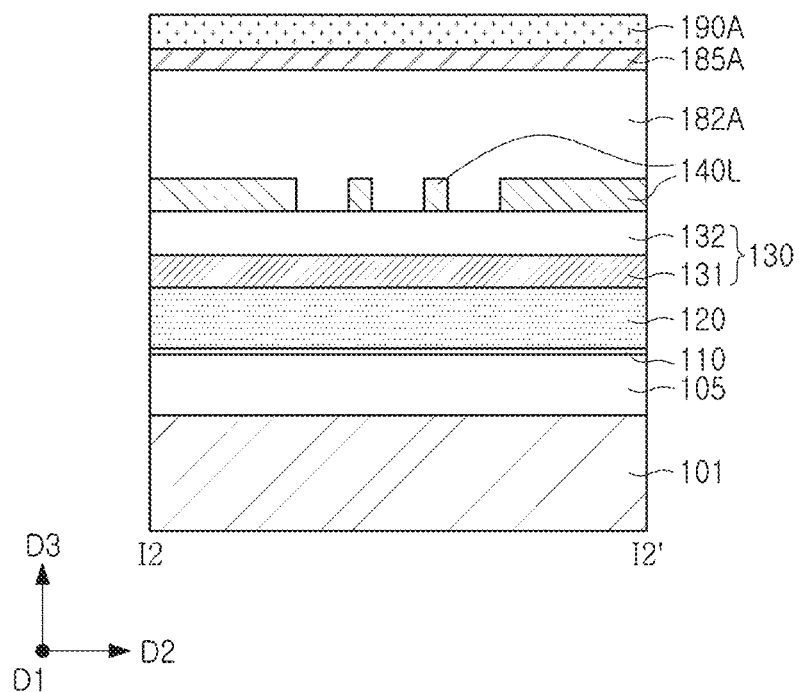
Figure 6A:
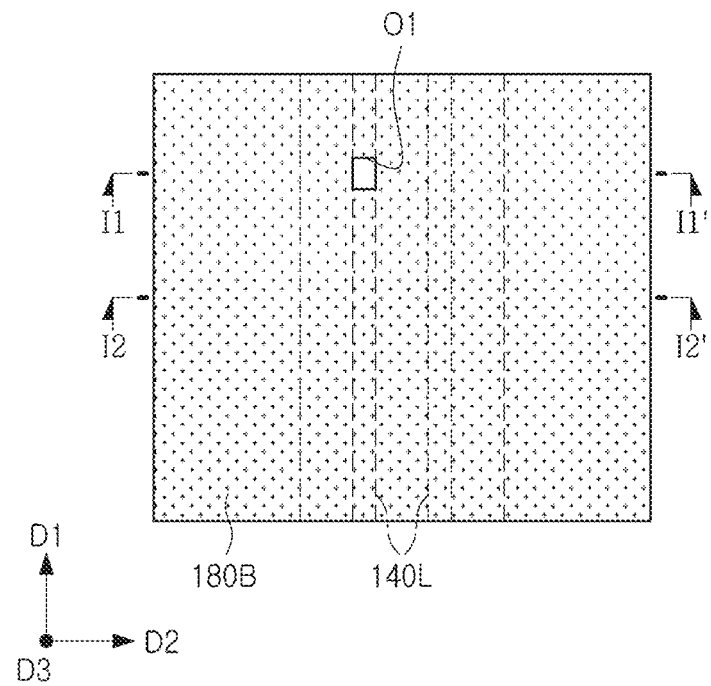
Figure 6B:
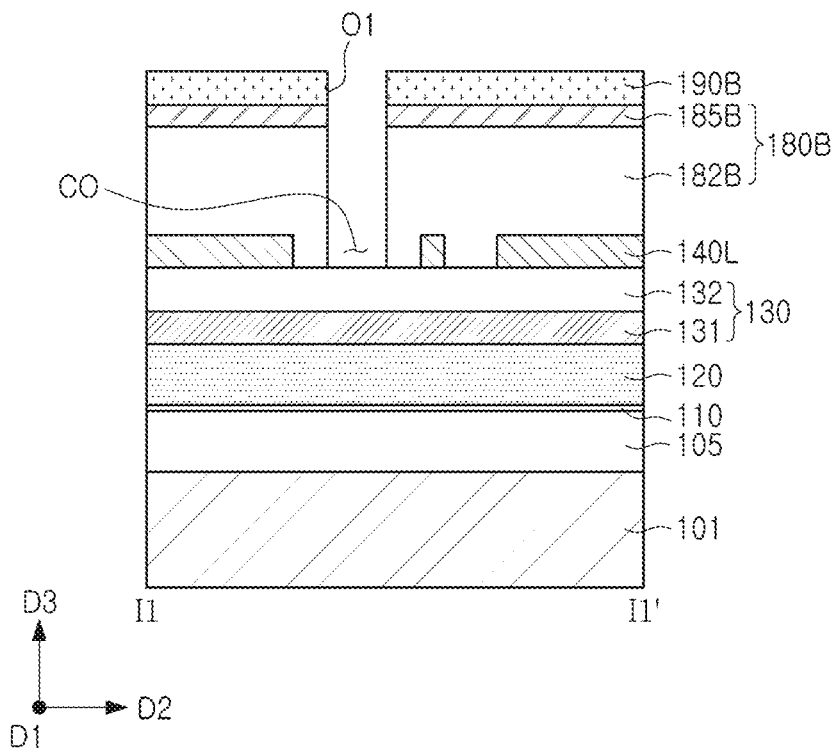
Figure 6C:
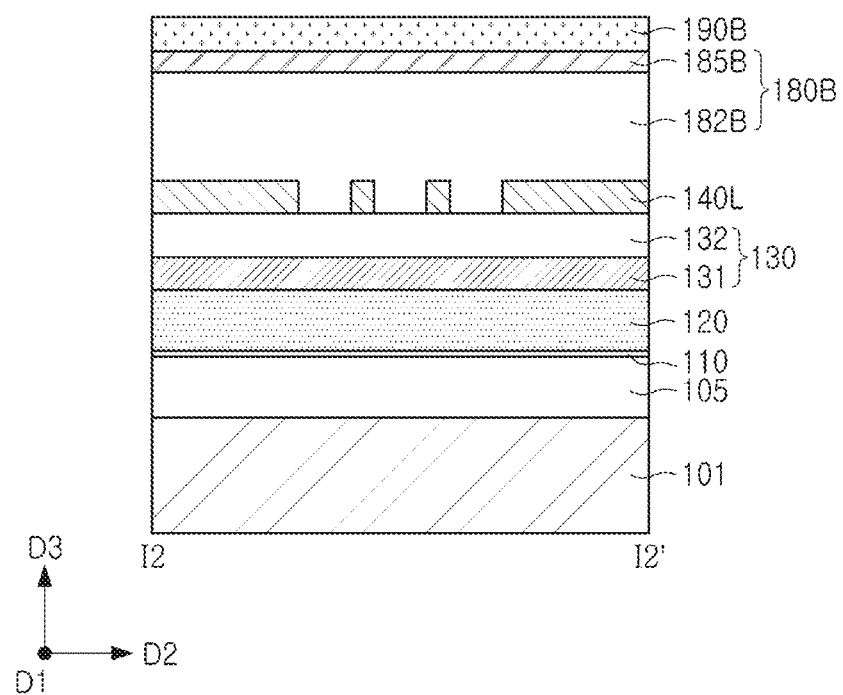

Referring to FIGS. 5A to 5C, a second mask structure 180B is formed, and a second photoresist pattern 190B having an opening O1 defining a cut-off region ("CO" in FIG. 7A) is formed on the second mask structure 180B. Next, referring to FIGS. 6A to 6C, the opening O1 defining the cut-off region CO may be formed in the second mask structure 180B, using the second photoresist pattern 190B.

The second mask structure 180B may include a second hard mask layer 182B and a second anti-reflection layer 185B are sequentially formed. The second mask structure 180B may be formed on the hard mask layer 130 on which the plurality of mandrel lines 140L are formed, and the opening O1 defining the cut-off region may be formed in the second mask structure 180B, e.g., using the photoresist pattern 190B. The description of the process using the second mask structure 180B and the second photoresist pattern 190B may be incorporated by reference with the description of the photolithography process with reference to FIGS. 2A and 2B and FIGS. 3A and 3B, except for the opening O1 for the cut-off region, for example, only for the pattern shape.

Figure 7A:
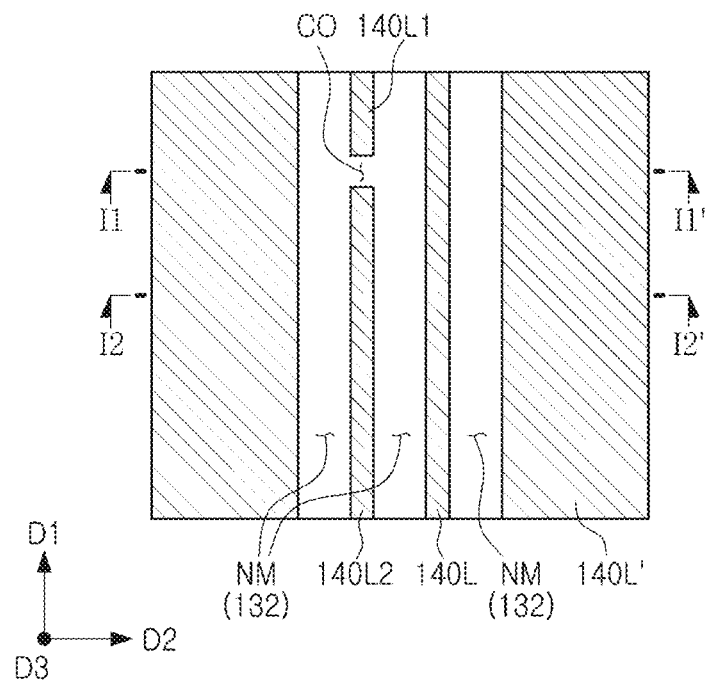
Figure 7B:
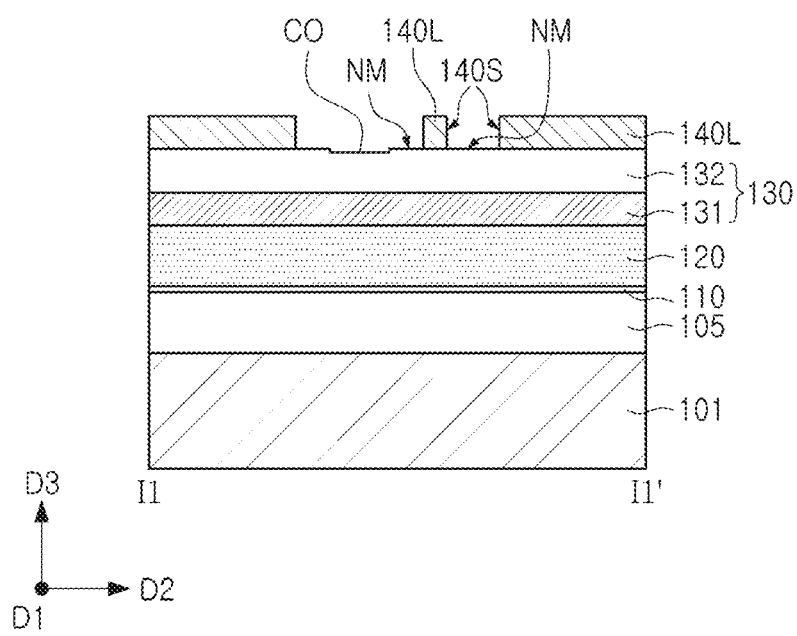
Figure 7C:
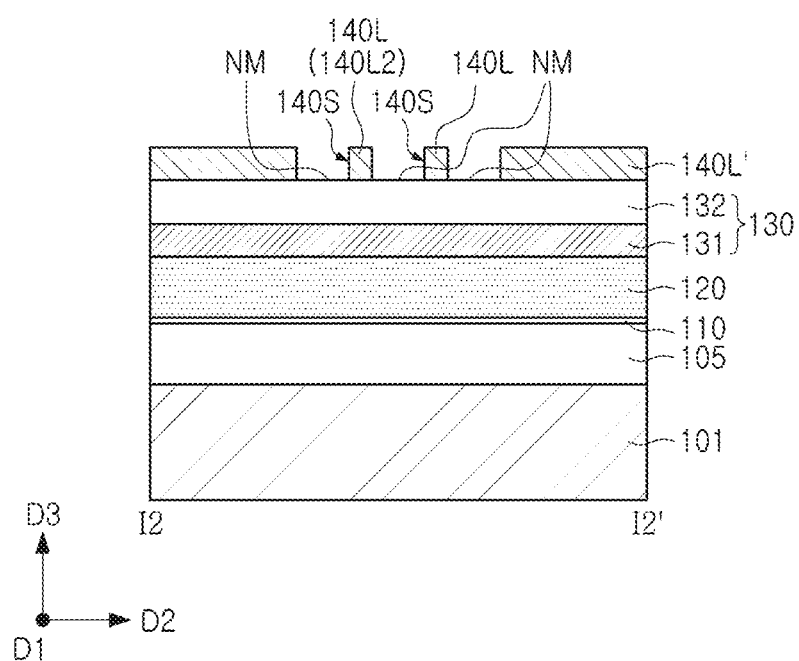
Figure 8A:
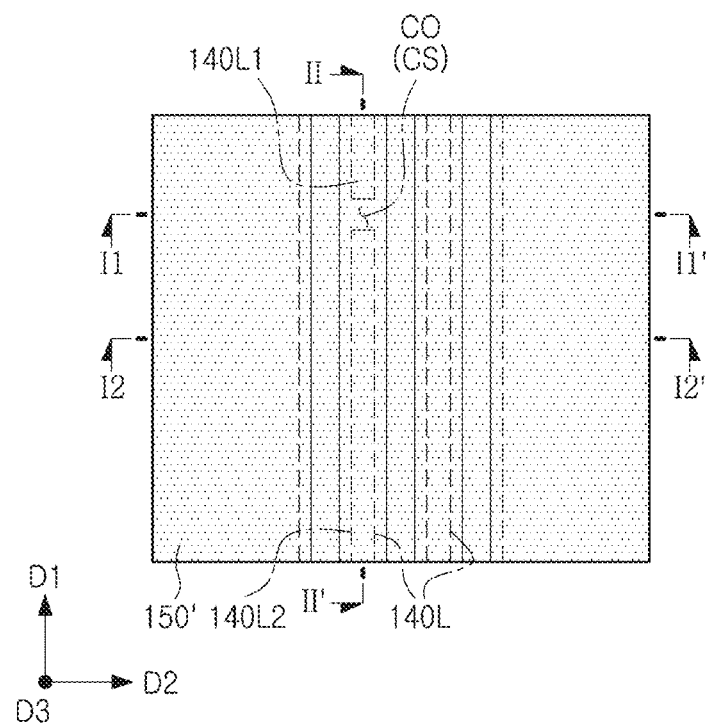
Figure 8B:
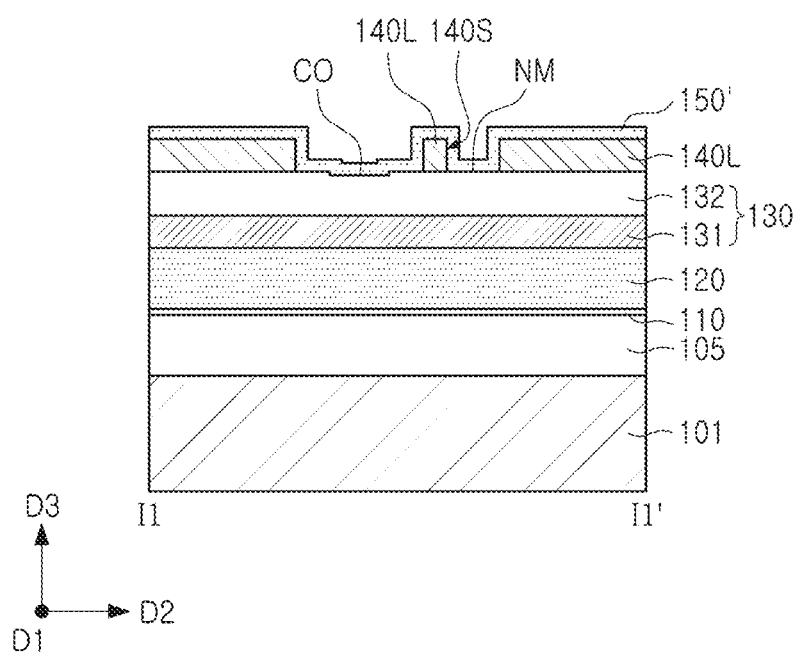
Figure 8C:
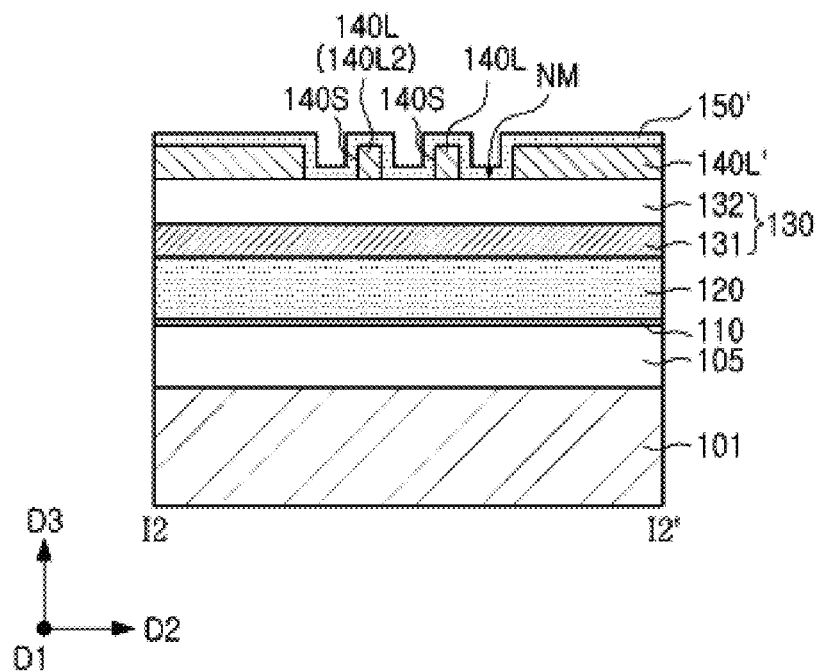
Figure 8D:
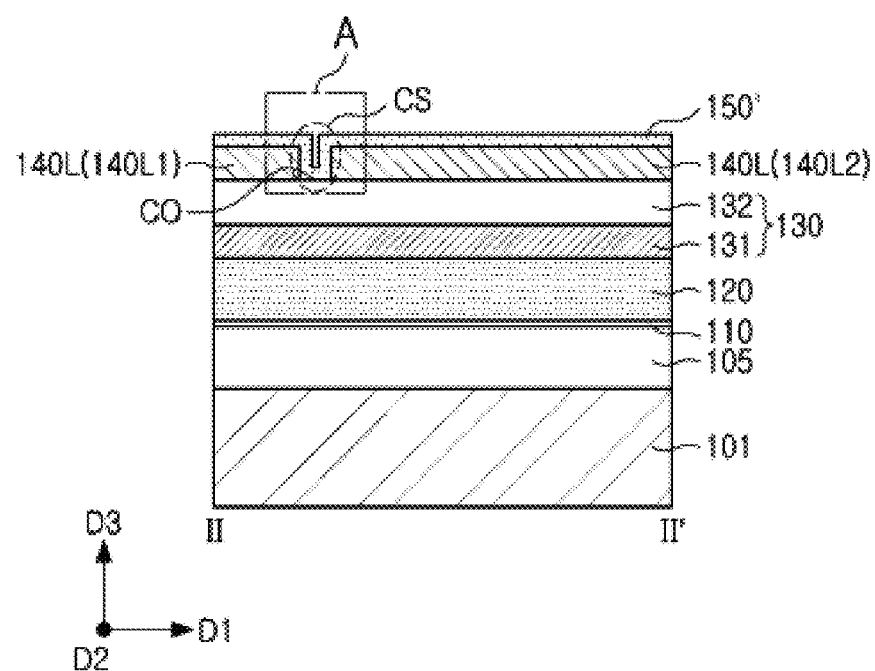
Figure 9A:
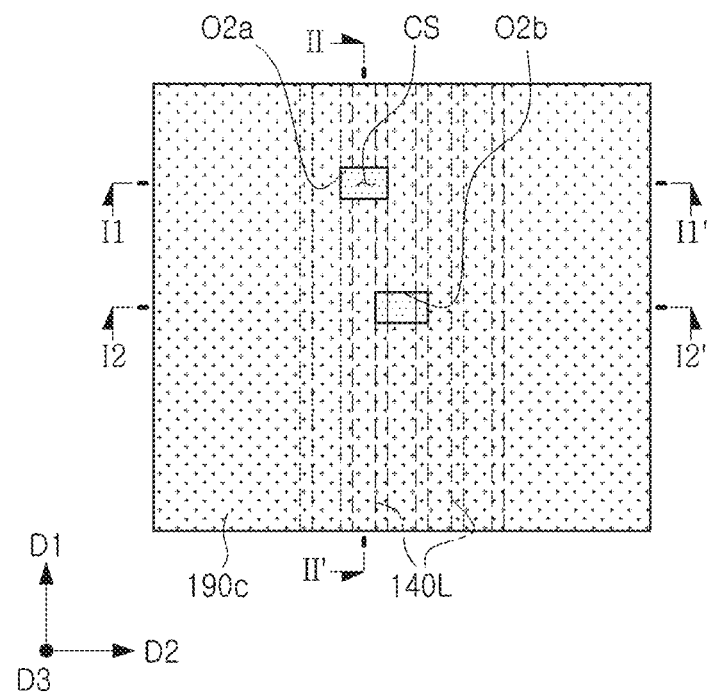
Figure 9B:
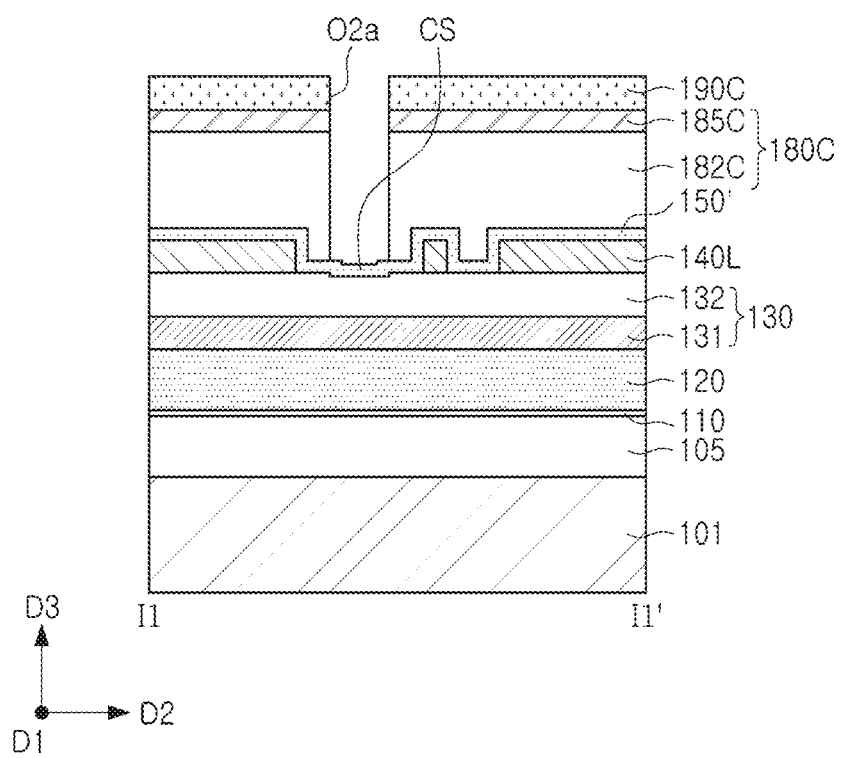
Figure 9C:
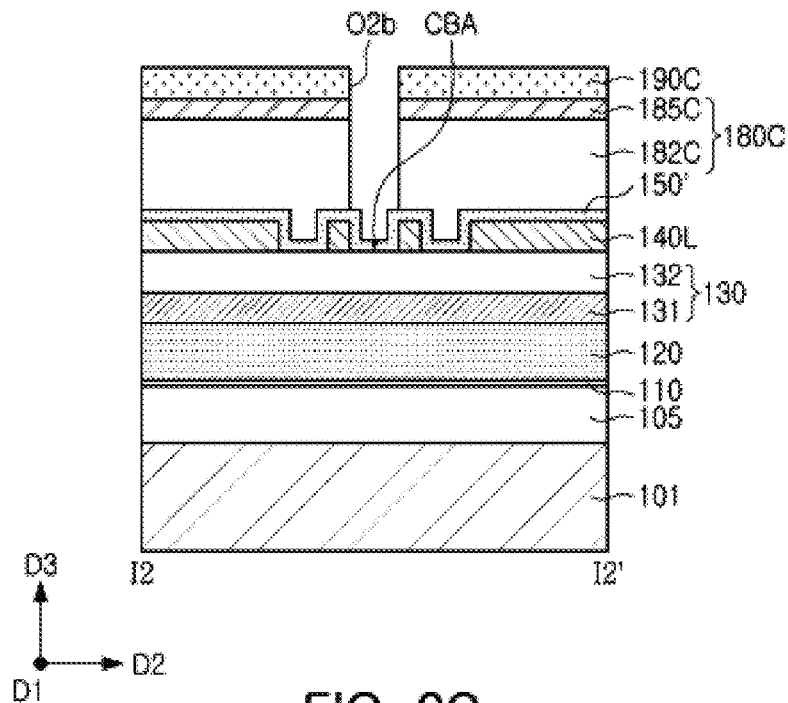
Figure 9D:
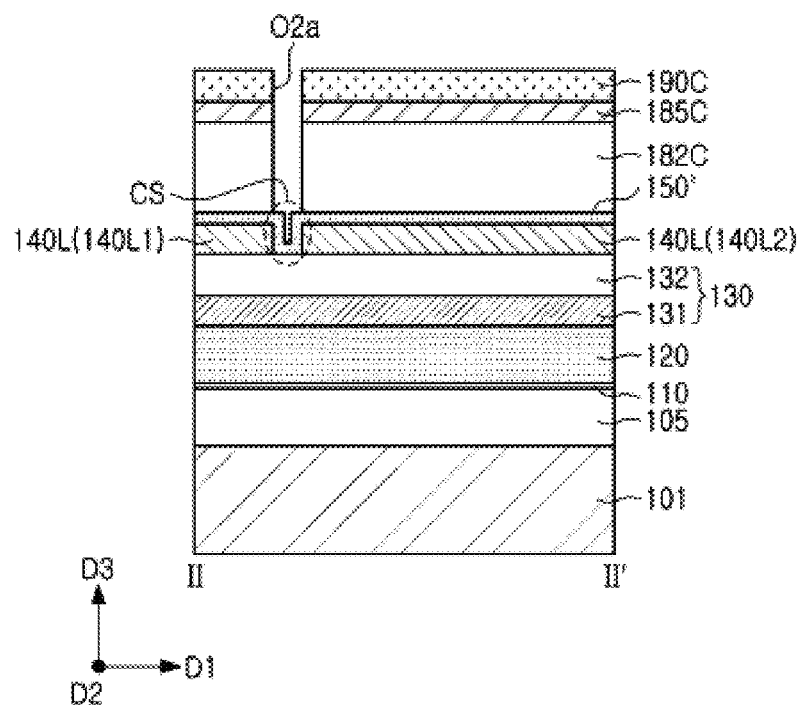
Figure 10A:
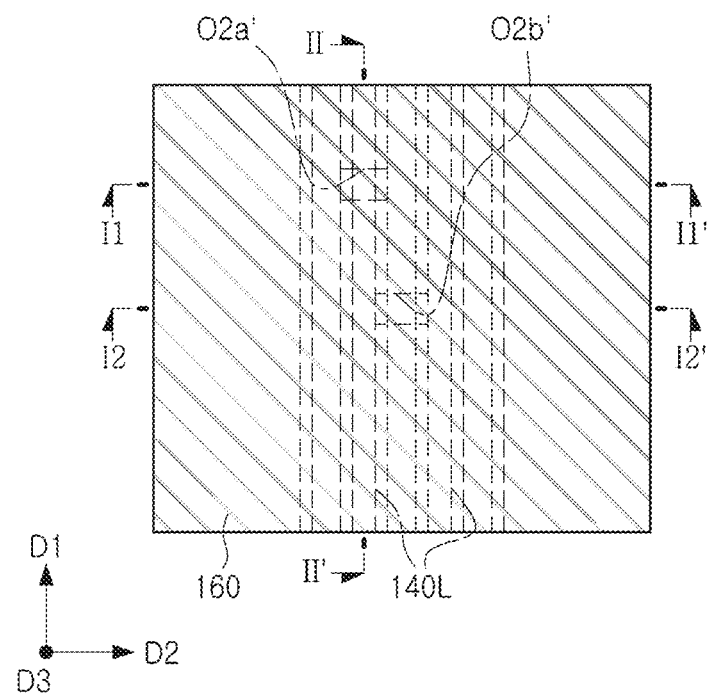
Figure 10B:
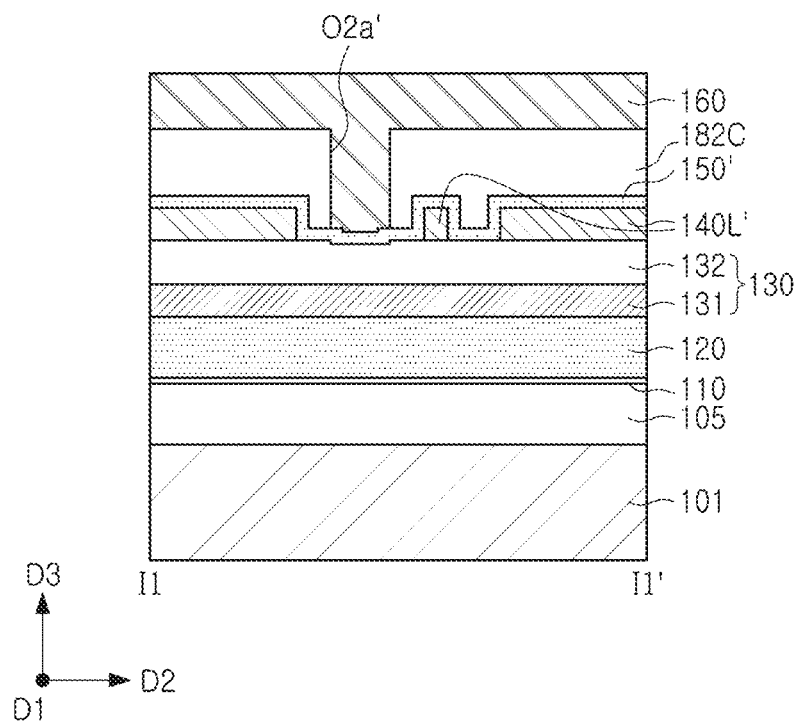
Figure 10C:
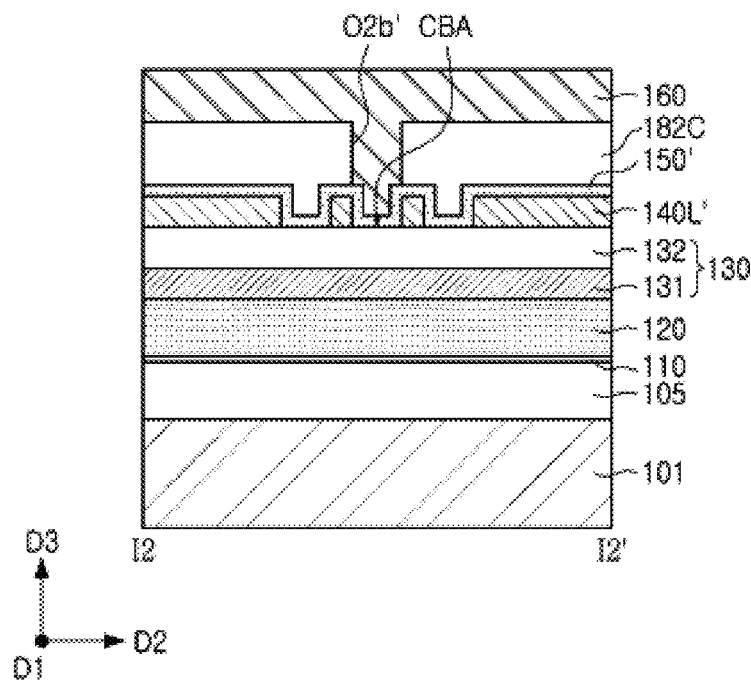
Figure 10D:
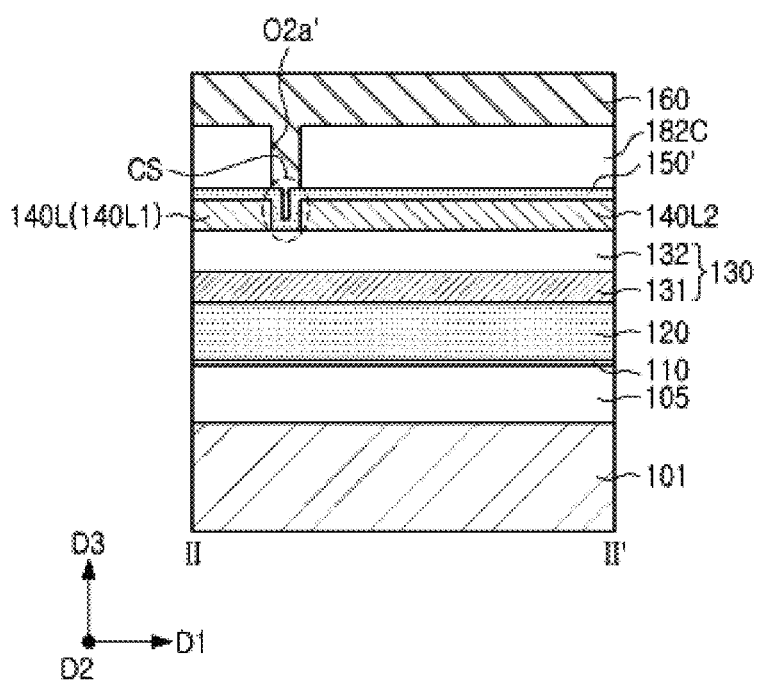
Figure 11A:
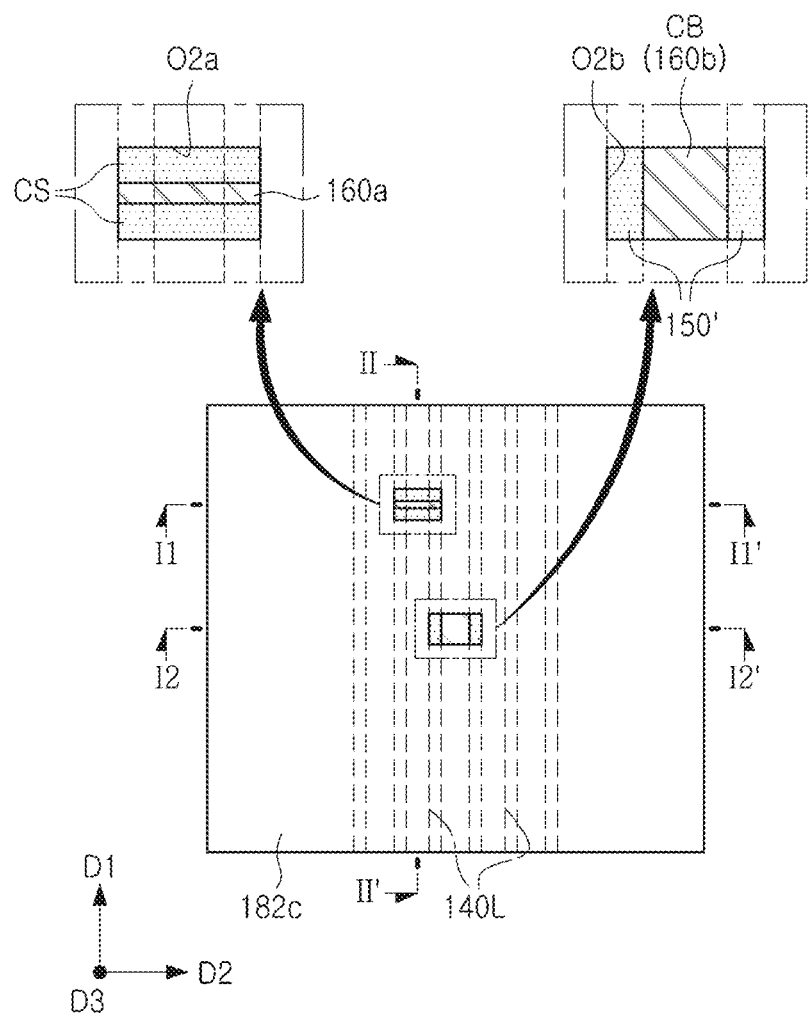
Figure 11B:
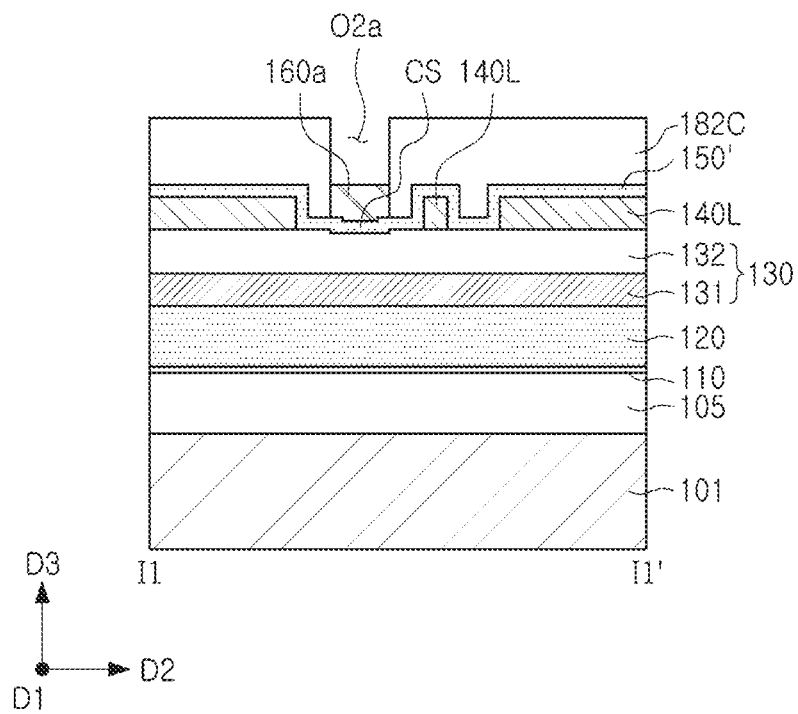
Figure 11C:
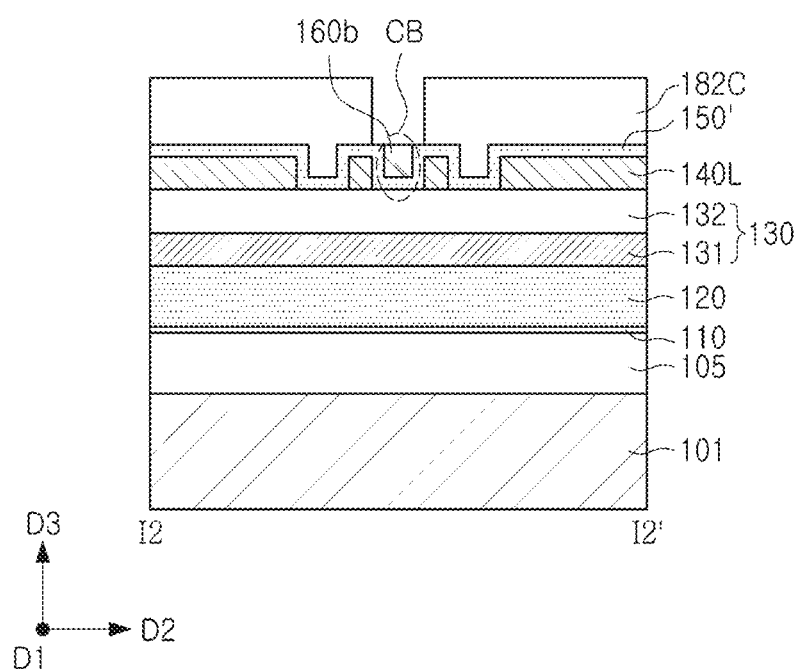
Figure 11D:
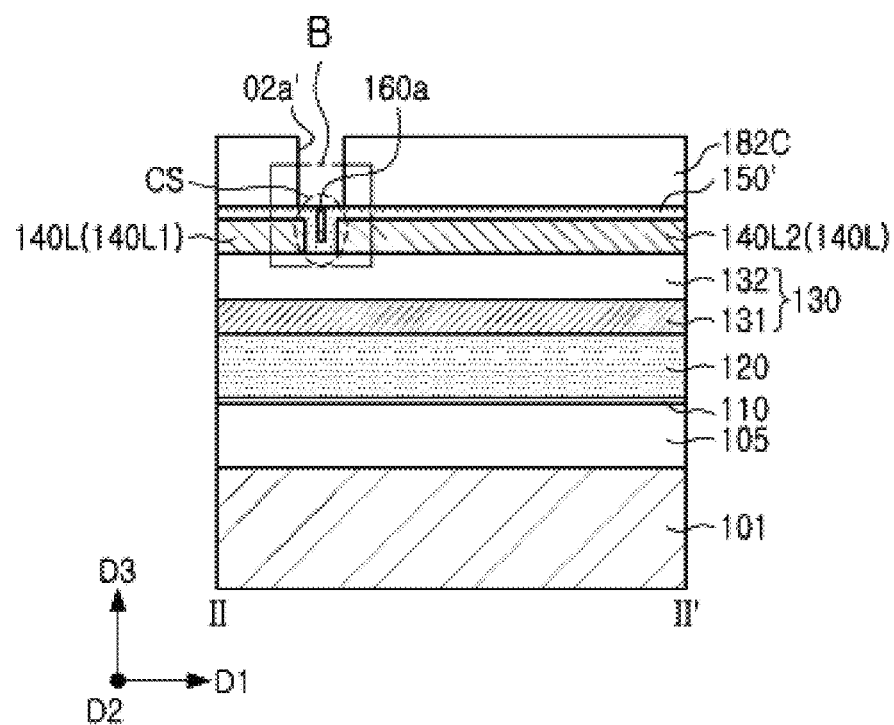

Referring to FIGS. 7A to 7C, the cut-off region CO is formed in a specific mandrel line 140L using the second mask stack 180B, and the second mask stack 180B is removed.

The cut-off region CO may be formed by removing a region of the mandrel line 140L exposed by the opening of the second mask stack 180B. This etching process may be performed, for example, by a RIE process. As such, the cut-off region CO may be formed in a portion of at least one mandrel line among the plurality of mandrel lines 140L. The mandrel line 140L in which the cut-off region CO is formed may be divided into two mandrel lines 140L1 and 140L2. The cut-off region CO is introduced as a structure for dividing a wiring line to be formed in a region corresponding to the mandrel line 140L into two lines in a subsequent process. The width of the cut-off region CO in the first direction D1 may have a limit in reduction. For example, the width of the cut-off region CO in the first direction D1 may be in a range of 15 to 30 nm. As illustrated in FIG. 7B, the cut-off region CO may be over-etched to have a relatively shallow recessed region in the second hard mask layer 132, but according to the etch selectivity of the second hard mask layer 132, an additional recess region may hardly be formed in the cut-off region CO.

After the cut-off region CO is formed, a spacer material layer 150' is formed, and the cut block CB is formed in a portion of the non-mandrel area NM.

FIGS. 8A to 11A are plan views illustrating a process of forming a cut spacer and a cut block in a method of fabricating a semiconductor device according to some example embodiments, FIGS. 8B to 11B are cross-sectional views taken along lines I1-I1' of planes of FIGS. 8A to 11A, respectively, FIGS. 8C to 11C are cross-sectional views taken along lines I2-I2' of planes of FIGS. 8A to 11A, respectively, and FIGS. 8D to 11D are cross-sectional views taken along lines I1-I1' of planes of FIGS. 8A to 11A, respectively.

Referring to FIGS. 8A to 8D, the spacer material layer 150' may be conformally formed on the hard mask layer 130 on which the mandrel lines 140L are disposed.

The spacer material layer 150' for a sidewall spacer may be formed on the upper surface of the second hard mask layer 132 to cover the upper and side surfaces of the plurality of mandrel lines 140L. For example, the spacer material layer 150' may be conformally deposited using a process such as an ALD process. The spacer material layer 150' may provide a sidewall spacer (also referred to as a self-aligned pattern) in a subsequent process. The spacer material layer may include an insulating material, for example, silicon oxide, silicon nitride, titanium oxide, titanium nitride, boron nitride, a combination thereof, and/or like.

The thickness of the spacer material layer 150' may be proportional to the width of the sidewall spacer 150 in FIGS.

14B and 14C, for example, the spacing of the final pattern. Accordingly, the spacer material layer 150' tends to be thin to implement a fine-pitch pattern. For example, the thickness of the spacer material layer 150' may be 15 nm or less, in detail, 10 nm or less.

Figure 12A:
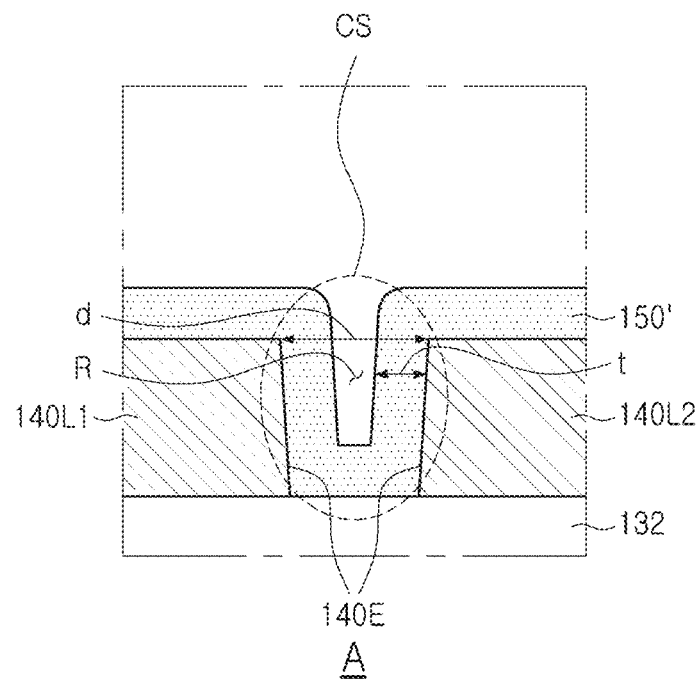
FIGS. 12A and 12B are partial enlarged views illustrating portions of FIGS. 8D and 11D, respectively.
Figure 12B:
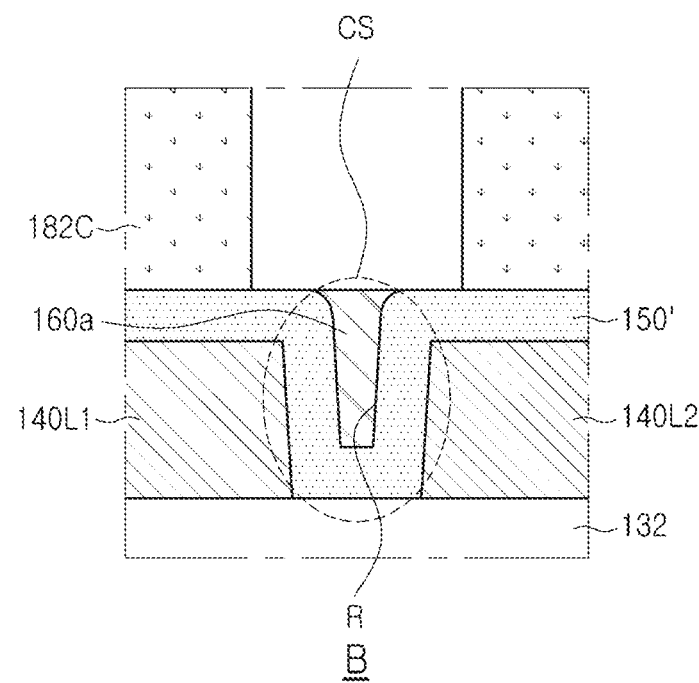

The spacer material layer 150' may fill in the cut-off region CO to form a cut spacer CS. For stable separation, the cut spacer CS may have a shape in which the cut-off region CO is almost completely filled. The spacer material layer 150' may be wider than half the width of the cut-off region CO in the first direction D1. If the width of the spacer material layer 150' is less than half the width of the cut-off region CO, the cut off region CO may not be properly filled by the material layer 150'. In some example embodiments, the cut-off region CO in the mandrel line 140L has a CD limit, as described above, and the thickness of the spacer material layer 150' should be reduced to implement a fine pitch, and thus, the cut-off region CO may not be completely filled by the spacer material layer 150'. FIG. 12A is an enlarged view of part A of FIG. 8D.

Referring to FIG. 12A, the incompletely filled cut spacer CS has a concave portion R. The concave portion R may extend in the second direction along the end surfaces 140E of the mandrel lines 140L1 and 140L2. Since the concave portion R of the cut spacer CS provides a relatively thin bottom portion, an unwanted opening may occur in the etch back for the sidewall spacer (for example, in the thin bottom portion), which may cause obstructions in the separation of the final pattern and may be a serious cause of short circuit defect when forming a wiring line. However, according to some example embodiments, the concave portion R of the cut spacer CS may be reinforced through a subsequent cut block forming process.

Referring to FIGS. 9A to 9D, a third mask stack 180C is formed on the spacer material layer 150', and a first opening O2a to which the cut spacer CS is exposed together with a second opening O2b for formation of a cut block in the third mask stack 180C, using a third photoresist pattern 190C.

A third hard mask layer 182C and a third anti-reflection layer 185C are sequentially formed on the spacer material layer 150', as the third mask structure 180C, and first and second openings O2a and O2b may be formed in the third mask structure 180C, using the third photoresist pattern 190C. Descriptions of the process using the third mask structure 180C and the third photoresist pattern 190C may be substantially the same as the descriptions of the photolithography process with reference to FIGS. 2A and 2B and FIGS. 3A and 3B, except for the pattern shape (for example, except for having the first and second openings), and therefore, for brevity, a repeat of the descriptions will be omitted.

The cut spacer CS may be re-exposed through the first opening O2a, and the area CBA for formation of the cut block CB may be exposed through the second opening O2b. The cut block forming area CBA may be located in the non-mandrel area NM. The cut block ("CB" in FIG. 11C) may be provided as a structure for separating a pattern (e.g., a wiring line) to be formed on the non-mandrel area NM, similar to the cut spacer CS of the mandrel line 140L.

Referring to FIGS. 10A to 10D, after the third photoresist pattern 180C and the third anti-reflection layer 185C are removed, a gap-fill material layer 160 is deposited using the third hard mask layer 182C. Next, referring to FIGS. 11A to 11D, by etching back the gap-fill material layer 160, the cut block CB may be formed, and the cut spacer CS may be reinforced.

The gap-fill material layer 160 is formed on the third hard mask layer 182C, and for example, may be provided to fill the concave portion of the cut spacer CS through the first opening O2a', together with a portion 160b filled on the cut block area CBA through the second opening O2b'. The deposition process of the gap-fill material layer 160 may be performed, for example, by an ALD process.

As illustrated in FIGS. 11A to 11D, the cut block CB and the reinforced cut spacer CS may be formed through an etch-back process. In some embodiments, the reinforced cut spacer CS may be provided in the form of filling the concave portion R of the cut spacer CS, extending in the second direction D2, referring to FIGS. 11A and 11B together with FIG. 12B. The space between the end surfaces 140E of the mandrel line 140L separated in two may be almost completely filled by the gap-fill material layer portion 160a filling the concave portion R. Accordingly, problems such as short circuit defects in wiring lines due to incomplete cut spacers may be prevented. As noted above, this reinforcement process may be easily implemented by changing the third photoresist pattern 190C used in the third photolithography process for the cut block and without an additional photolithography process.

In addition, the cut block CB may be formed in the non-mandrel area NM between the spacer material layer portions (e.g., sidewall spacers to be described later) located on the sidewalls 140S of the mandrel line 140L), to have a required width (the width in the first direction D1). The width of the cut block CB in the first direction D1 may define a separation interval of the final pattern (wiring line) in the first direction D1, similarly to the width of the cut spacer CS in the first direction.

As illustrated in FIGS. 11A to 11D, after the cut spacer CS is reinforced and the cut block CB is formed, a process of forming the sidewall spacer 150 from the spacer material layer 150' is performed.

FIGS. 13A to 17A are plan views illustrating sidewall spacer formation and second mask pattern formation in a method of fabricating a semiconductor device according to some example embodiments, FIGS. 13B to 17B are cross-sectional views taken along lines I1-I1' of planes of FIGS. 13A to 17A, respectively, and FIGS. 13C to 17C are cross-sectional views taken along lines I2-I2' of planes of FIGS. 13A to 17A, respectively.

Figure 13A:
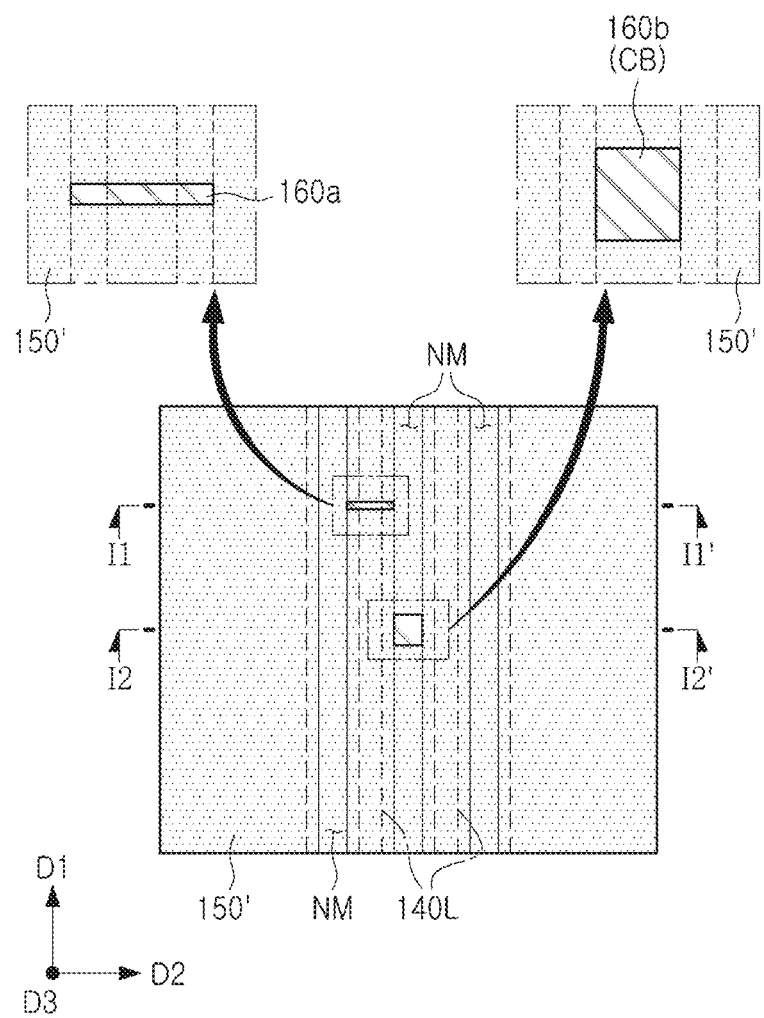
Figure 13B:
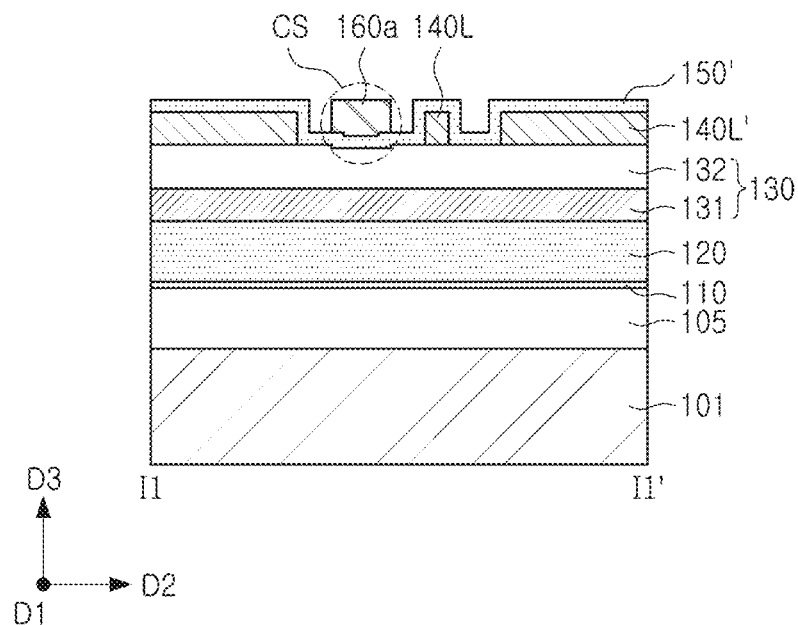
Figure 13C:
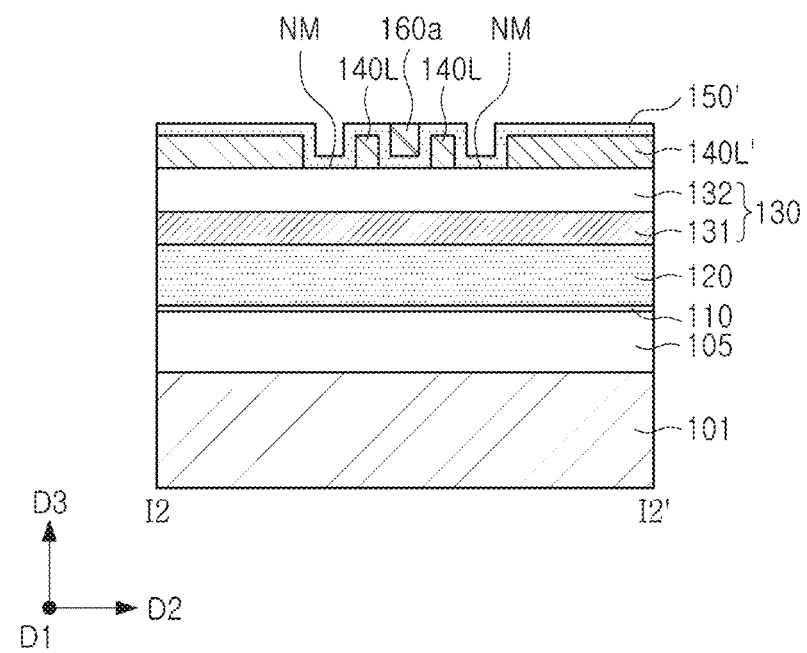
Figure 14A:
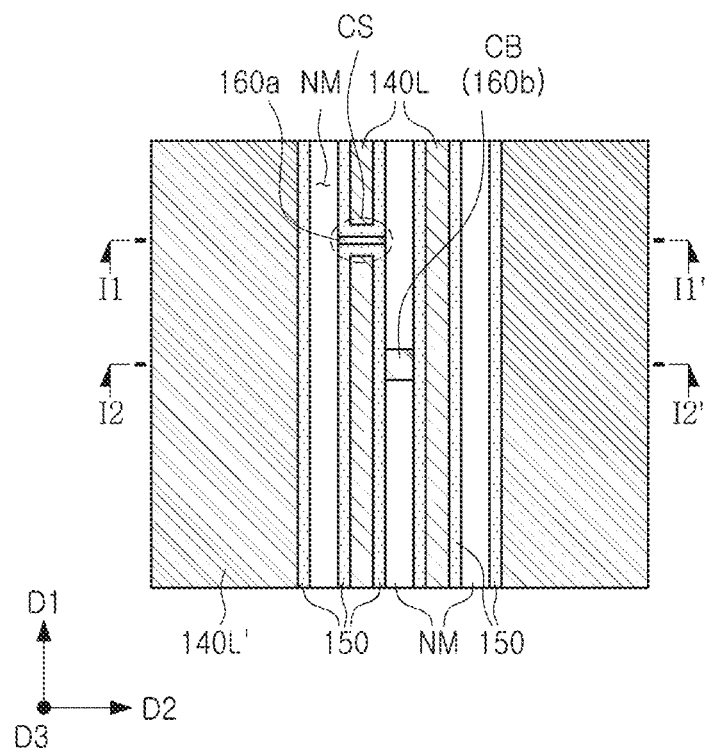
Figure 14B:
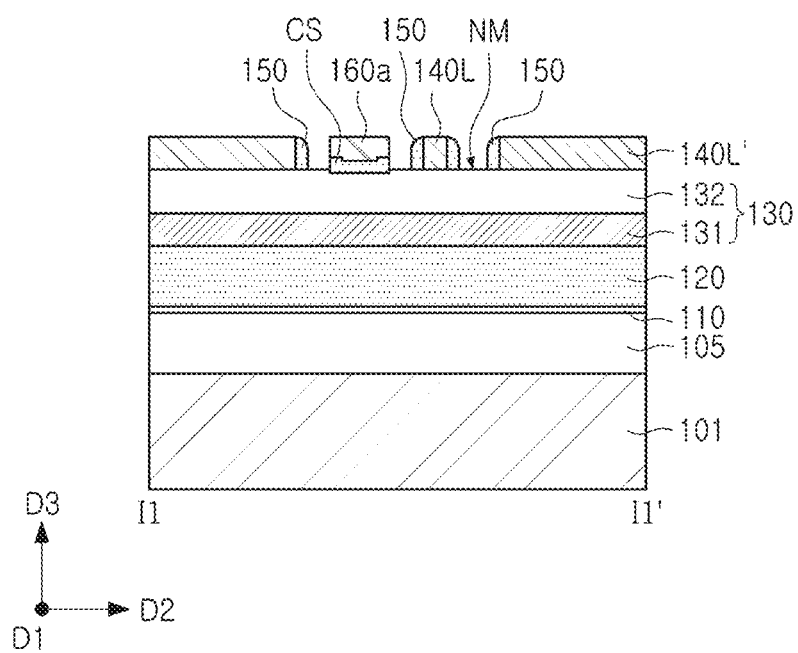
Figure 14C:
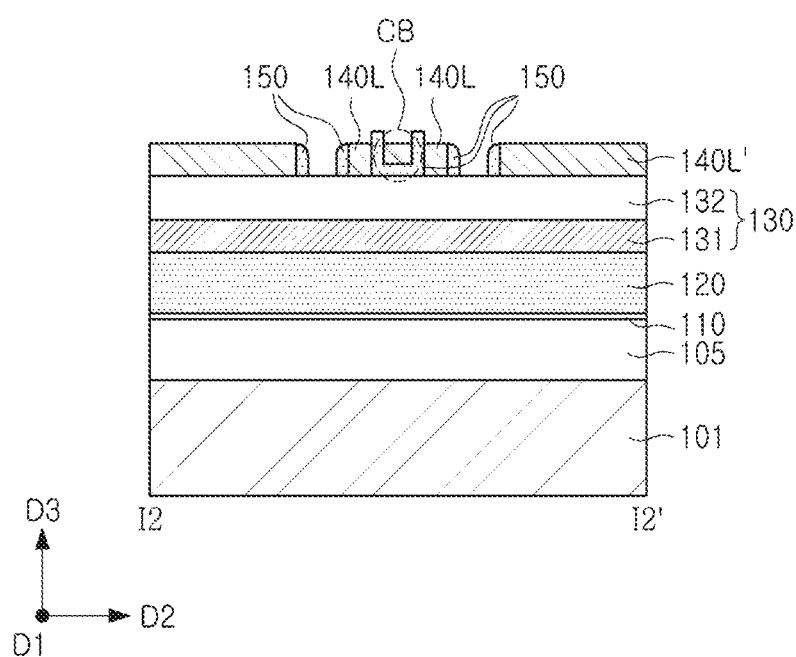

Referring to FIGS. 13A to 13C, the third hard mask layer 182C is removed. Next, referring to FIGS. 14A to 14C, the sidewall spacers 150 may be formed by applying an etch-back to the spacer material layer 150'.

For example, the spacer material layer 150' may be etched back to form sidewall spacers 150 on respective sidewalls 140S of the plurality of mandrel lines 140L. In this etching-back process, the upper surfaces of the plurality of mandrel lines 140L are exposed, and the spacer material layer portion positioned on the sidewalls 140S of the plurality of mandrel lines 140L remains as the sidewall spacer 150, and the remaining sidewall spacer 150 may define spacing for the final pattern. The sidewall spacer 150 is also referred to as a "self-aligned pattern". In addition, on the second hard mask layer 132, among the non-mandrel areas NM between the sidewall spacers 150, a portion except for the cut block CB may be exposed together with the upper surfaces of the plurality of mandrel lines 140L. For example, the etch-back for forming the sidewall spacers 150 may be performed using an anisotropic RIE process.

Figure 15A:
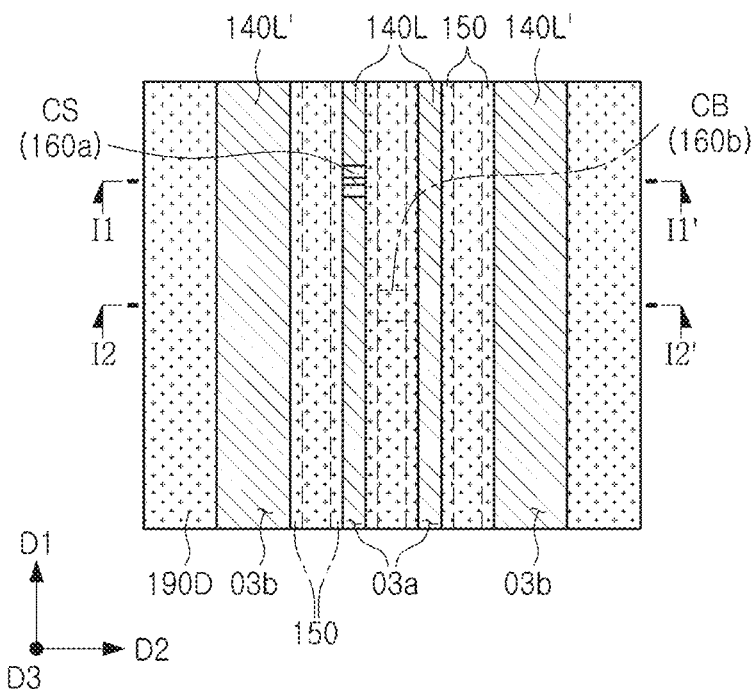
Figure 15B:
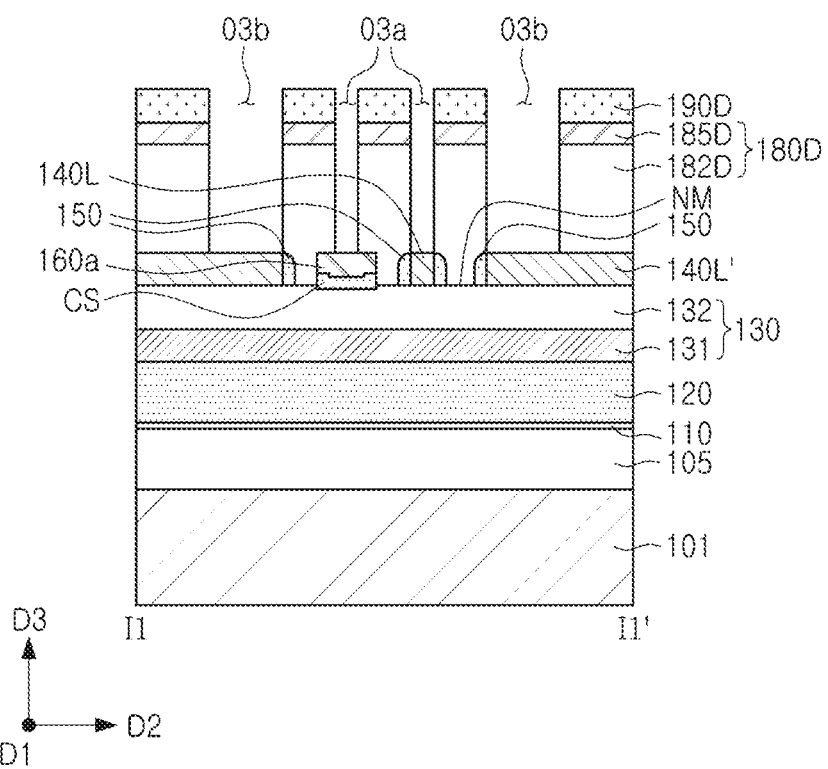
Figure 15C:
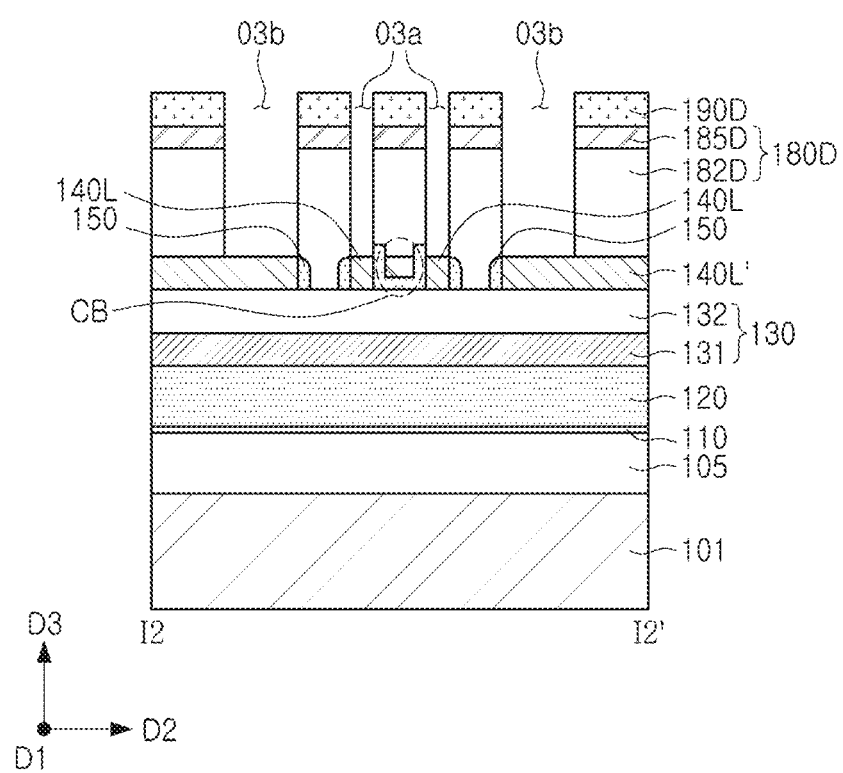

Referring to FIGS. 15A to 15C, a fourth mask stack 180D is formed on the hard mask layer 130 on which the mandrel lines 140 and the sidewall spacers 150 are positioned, and third and fourth openings O3a and O3b are exposed are formed on the fourth mask stack 180D, using a fourth photoresist pattern 190D.

A fourth hard mask layer 182D and a fourth anti-reflection layer 185D are sequentially formed on the hard mask layer 130, as a fourth mask structure 180D, and third and fourth openings O3a and O3b may be formed in the fourth mask structure 180D, using a fourth photoresist pattern 190D. Descriptions of the process using the fourth mask structure 180D and the fourth photoresist pattern 190D may be substantially the same as the description of the photolithography process with reference to FIGS. 2A and 2B and FIGS. 3A and 3B, except for having a pattern shape (for example, except the third and fourth openings O3a and O3b), and therefore, for brevity, a repeat of the descriptions will be omitted.

The third and fourth openings O3a and O3b may be designed to remove the mandrel line 140L in contact with the sidewall spacer 150. The third opening O3a may be formed in a region corresponding to the mandrel lines 140L in which the sidewall spacers 150 are located on both sidewalls, and the fourth opening O3b may be configured such that an area of a relatively large width may be removed from the peripheral mandrel area 140L'. In some embodiments, the area obtained by the fourth opening O3b may be provided as a space constituting a peripheral circuit.

Figure 16A:
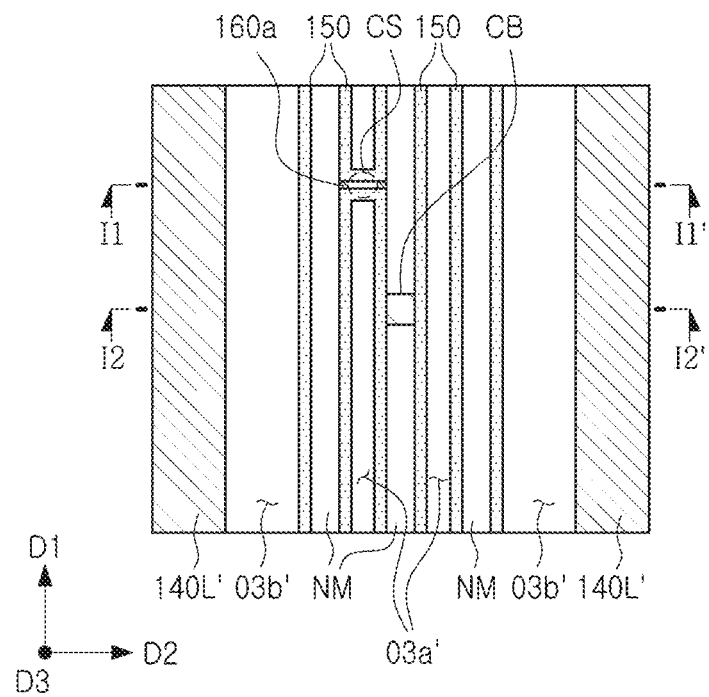
Figure 16B:
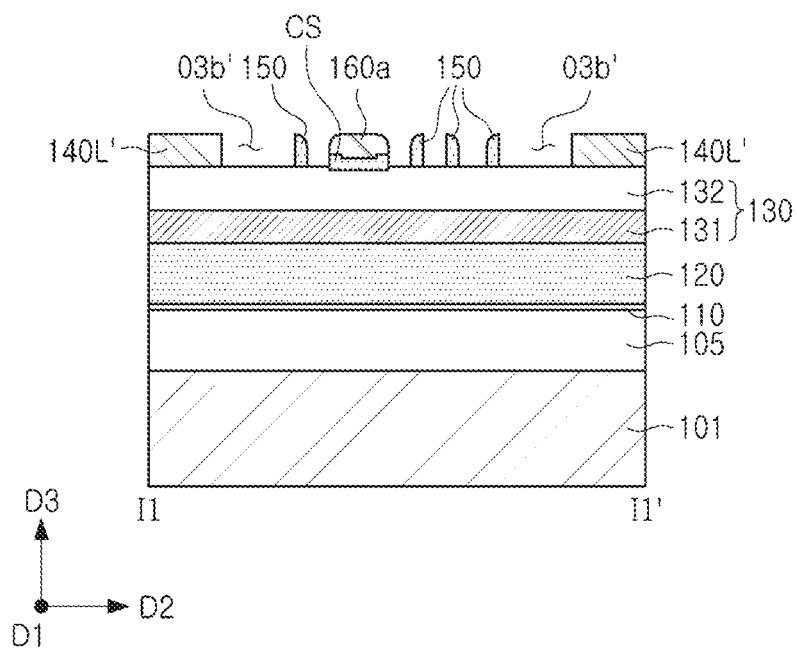
Figure 16C:
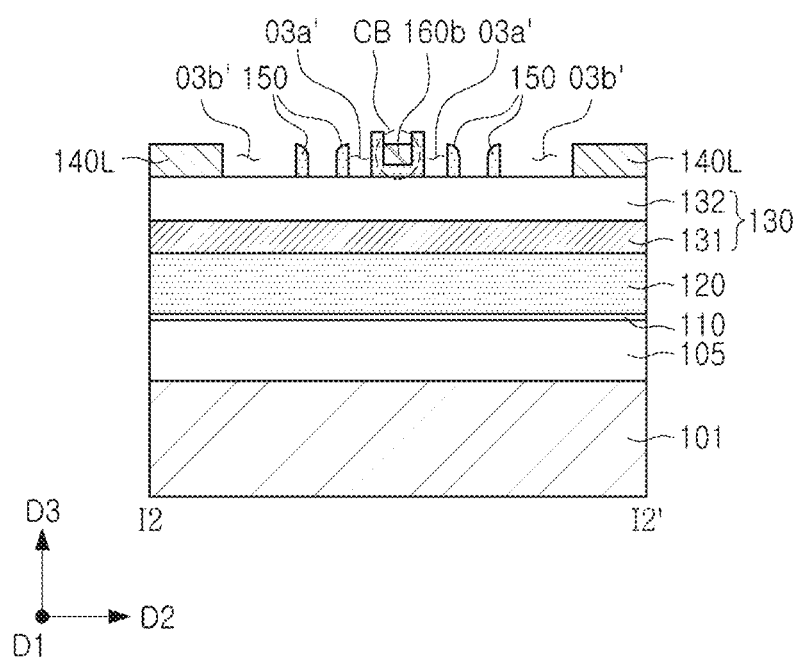

Referring to FIGS. 16A to 16C, a self-aligned pattern formed of the sidewall spacer 150 may be obtained by selectively removing the mandrel line 140L using the fourth mask stack 180D. Next, the fourth mask stack 180D may be removed.

The sidewall spacers 150, which are self-aligned patterns, may define an interval of the final pattern, and line spaces O3a' and NM' between the sidewall spacers 150 may define the width of the final pattern. As illustrated in FIG. 16A, the first line space O3a' from which the mandrel line 140L is removed and the second line space NM' defined in the non-mandrel area may define an area for a fine pattern. In this case, as illustrated in FIGS. 16A and 16B, the left first line space O3a' may be stably divided into two line spaces by the cut spacer CS. For example, the cut spacer CS may include a spacer material layer portion and a gap-fill material portion 160a filled thereon. Also, as illustrated in FIGS. 16A and 16C, the second line space NM' on the left may be stably divided into two line spaces by the cut block CB. For example, the cut spacer CS may include a spacer material layer portion that is the bottom and a gap-fill material portion 160a disposed thereon. On the other hand, a line space O3b' located in the peripheral mandrel area 140L' has a relatively large width. For example, in this line space O3b', wiring lines constituting a peripheral circuit may be formed.

Figure 17A:
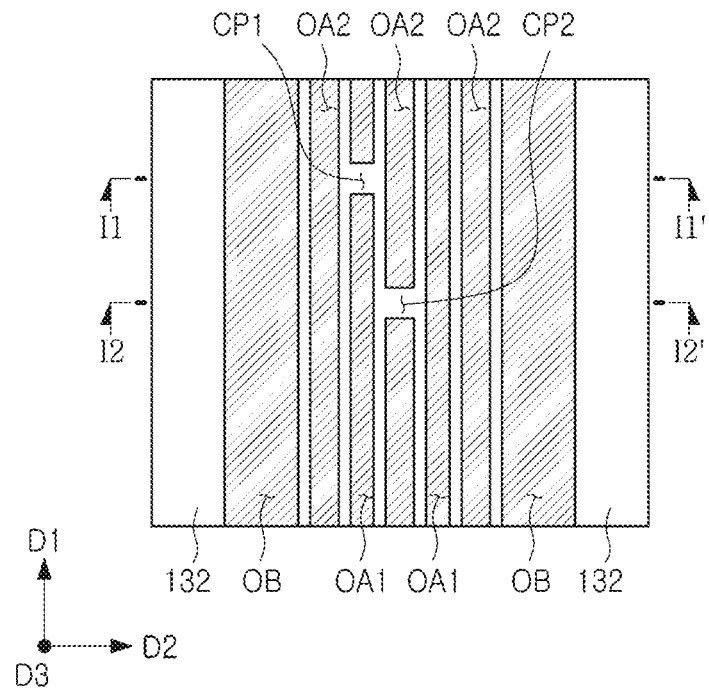
Figure 17B:
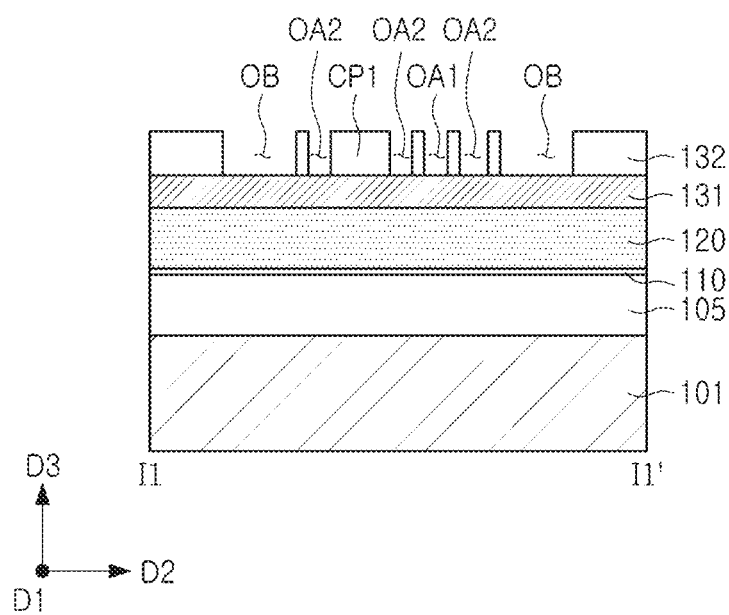
Figure 17C:
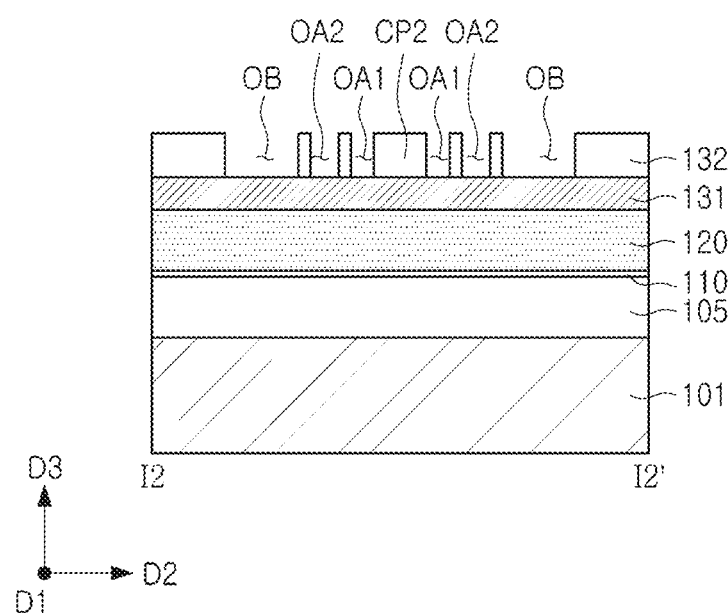

Referring to FIGS. 17A to 17C, a second mask pattern is formed by etching the second hard mask layer 132 using the cut spacer CS and the cut block CB together with the sidewall spacers 150.

Also in the second mask pattern, two first line spaces OA1 and two second line spaces OA2 are alternately disposed, and first and second line spaces OA1 and OA2 positioned on the left may be separated into two line patterns by separation regions CP1 and CP2 defined by the spacer and the cut block are cut spacers, respectively. In addition, a third line space OB defined by the line space O3b' of the peripheral mandrel area 140L' may be provided on both sides. However, the example embodiments are not limited thereto. For example, the second mask pattern may include more than two of the first and/or second line spaces OA1 and/or OA2.

Figure 18A:
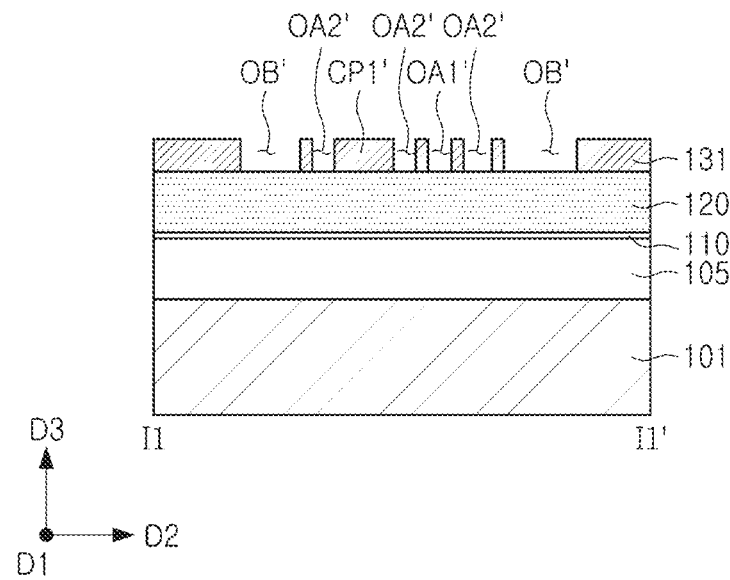
Figure 18B:
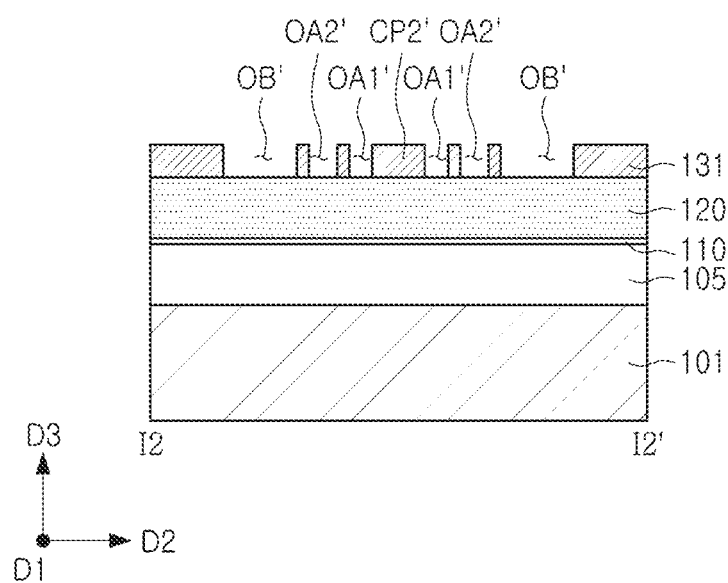

Referring to FIGS. 18A and 18B, the first mask pattern may be formed by etching the first hard mask layer 131 using the second mask pattern.

Similar to the second mask pattern, in the first mask pattern, first to third line spaces OAF, OA2', and OB' may be located in regions corresponding to the first to third line spaces OA1, OA2, and OB. The first and second line spaces OA1' and OAT located on the left side may also be divided into two line patterns by separation regions CP1' and CP2'.

Figure 20A:
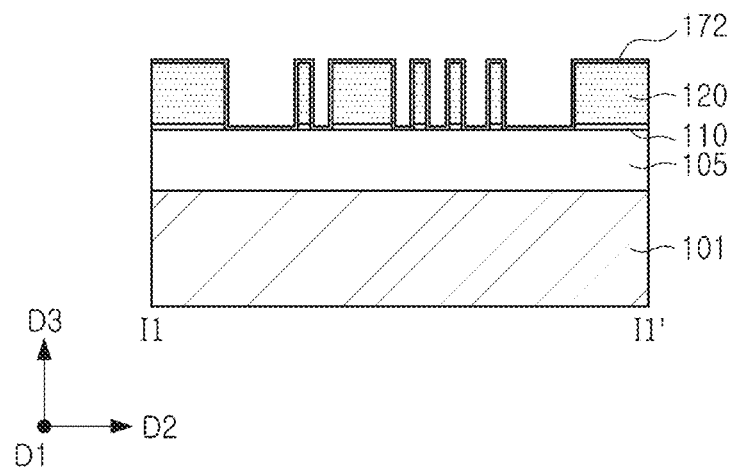
Figure 20B:
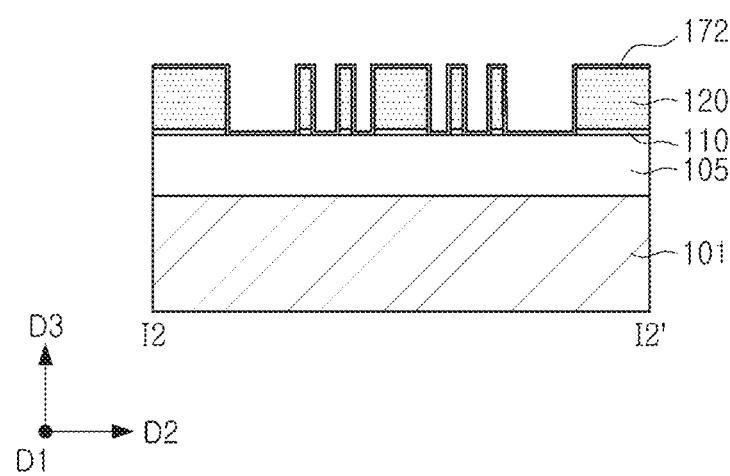
Figure 21A:
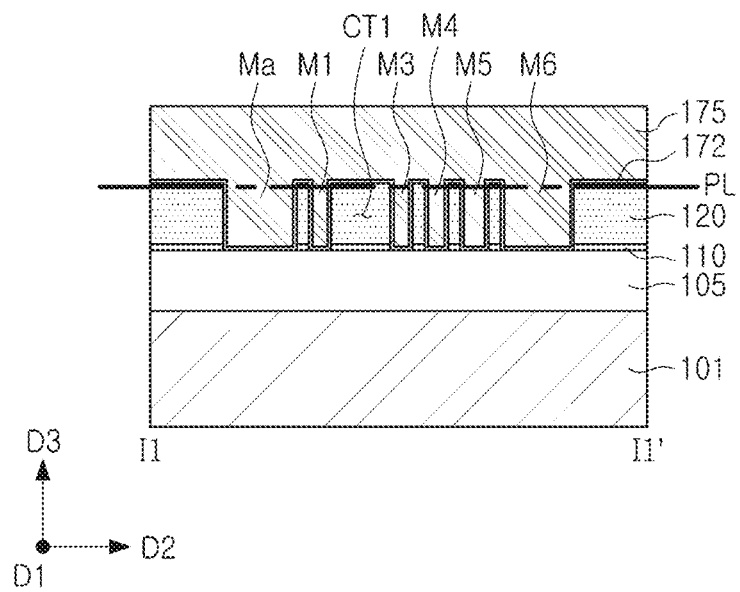
Figure 21B:
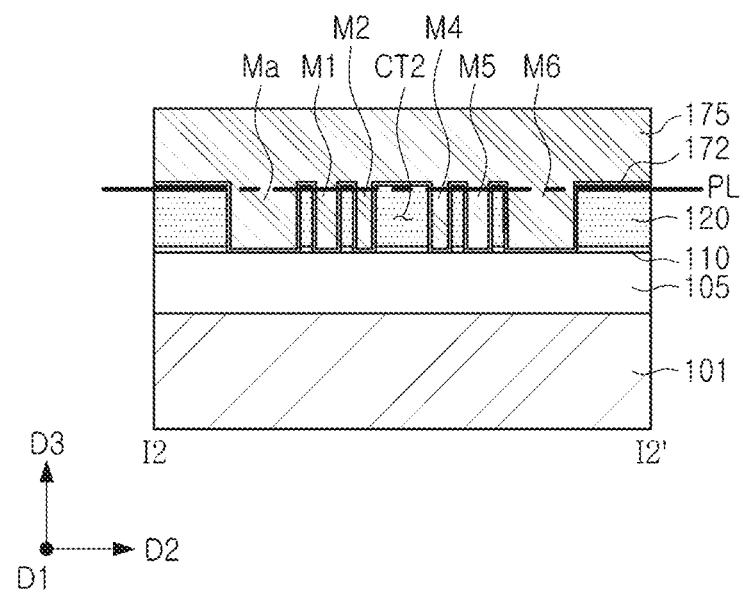
Figure 22:
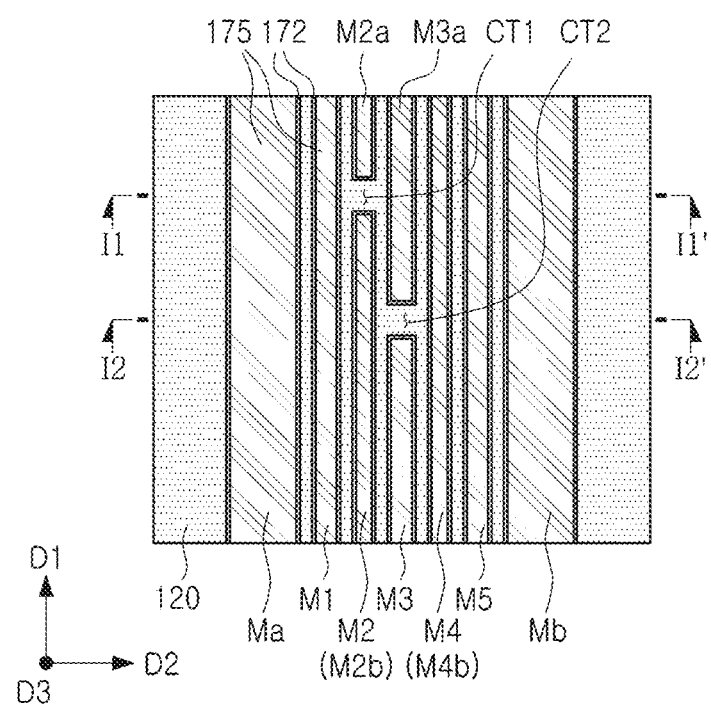
FIG. 22 is a plan view of FIG. 21A and FIG. 21B.

FIGS. 19A to 21A and 19B to 21B are cross-sectional views illustrating a wiring line forming process of a method of fabricating a semiconductor device according to some example embodiments, respectively, and FIG. 22 is a plan view of FIGS. 21A and 21B.

Figure 19A:
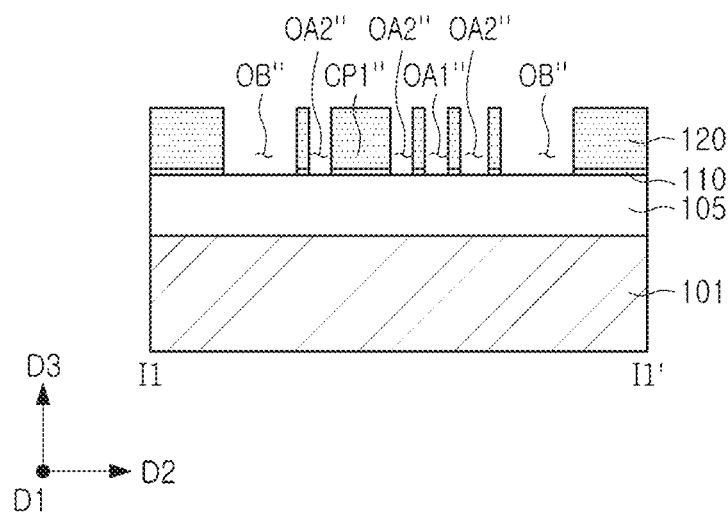
Figure 19B:
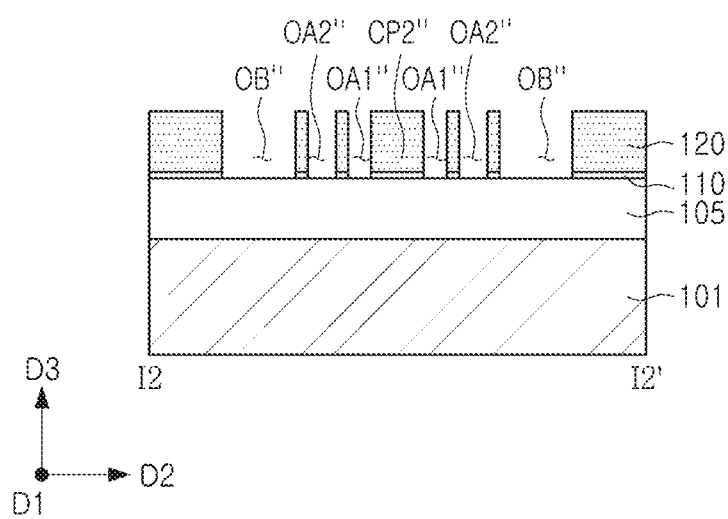

Referring to FIGS. 19A and 19B, the dielectric layer 120 is patterned using the first mask pattern. First to third trenches OA1", OA2" and OB" corresponding to the first to third line spaces OAF, OAT, and OB', respectively, are formed in the dielectric layer 120. In this process, a portion of the etch stop layer 110 exposed on the bottom surfaces of the first to third trenches OA1 ", OAT', and OB" may also be removed. The first to third trenches OA1 ", OA2", and OB" may define a shape of a wiring line to be formed in a subsequent process. The first and second trenches OA1" and OA2" located on the left may also be divided into two regions by the separation patterns CP1" and CP2".

Referring to FIGS. 20A and 20B, a conductive barrier 172 may be formed on the dielectric layer 120 in which the first to third trenches OA1", OA2", and OB" are formed. The conductive barrier 172 may be employed to prevent diffusion of elements of a conductive layer to be formed in a subsequent process. For example, the conductive barrier 172 may include a conductive nitride such as TiN, TaN, AlN, WN, a combination thereof, and/or the like.

Referring to FIGS. 21A and 21B, a conductive layer 175 is formed on the dielectric layer 120 to fill the first to third trenches OA1", OA2", and OB". The conductive layer 175 may include a conductive material, for example, gold (Au), titanium (Ti), copper (Cu), silver (Ag), aluminum (Al), tungsten (W), cobalt (Co), chromium (Cr), molybdenum (Mo), zirconium (Zr), nickel (Ni), tantalum (Ta), platinum (Pt), alloys thereof, and/or the like. The conductive layer formation may be performed using, for example, a deposition process such as physical vapor deposition (PVD) or chemical vapor deposition (CVD) and a plating process such as electroplating and electroless plating.

Next, a planarization process of the conductive layer 175 may be performed. The planarization process of the conductive layer 175 may be performed until the upper surface of the dielectric layer 120 is exposed ("PL" line). This planarization process may be performed by, for example, a chemical mechanical polishing (CMP) process.

Accordingly, as illustrated in FIG. 22, first to fifth wiring lines M1, M2, M3, M4 and M5 and two peripheral wiring lines Ma and Mb may be formed in the dielectric layer 120. The first wiring line M1 is divided into two wiring lines M1a and M1b by a first dielectric pattern CT1, and similarly, the second wiring line M2 may be divided into two wiring lines M2a and M2b by a second dielectric pattern CT2. The first and second dielectric patterns CT1 and CT2 may respectively be provided in a solid shape by the reinforced cut spacers CS and cut blocks CB.

On the other hand, the first to fifth wiring lines M1, M2, M3, M4, and M5 may each have patterns provided by different components.

The second and fourth wiring lines M2 and M4 may be referred to as "mandrel wiring lines" corresponding to the area defined by the mandrel line 140L. Also, the first, third, and fifth wiring lines M1, M3, and M5 may be referred to as "non-mandrel wiring lines" defined by the sidewall spacers 150 in the non-mandrel area NM. All the wiring lines M1, M2, M3, M4, and M5 may have the same spacing defined by the width of the sidewall spacer 150, and the mandrel metal line and the non-mandrel wiring line are designed to have the same width, but the example embodiments not limited thereto, and in some embodiments, at least two of the wiring lines M1, M2, M3, M4, and M5 may have different widths.

The wiring lines may also be implemented in a form different from and/or more complex than the wiring lines illustrated in FIG. 22. For example, though the above example provides only one cut spacer and one cut block were illustrated as an example, the cut spacer and/or the cut block may be introduced in plural respectively. For example, two or more cut spacers and/or two or more cut blocks may be formed in one line (mandrel line or non-mandrel area).

As a modified example, the cut spacer and the cut block may be implemented in a form arranged side by side in the second direction. FIGS. 23A to 26A are plan views of a main process for a method of fabricating a semiconductor device according to a modified example, and FIGS. 23B to 26B are cross-sectional views of FIGS. 23A to 26A, respectively.

Figure 23A:
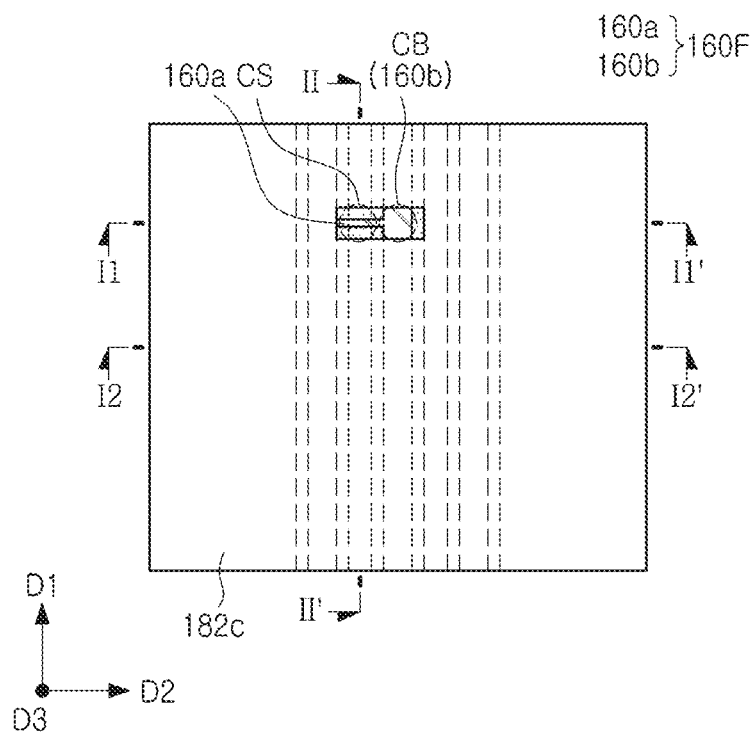
Figure 23B:
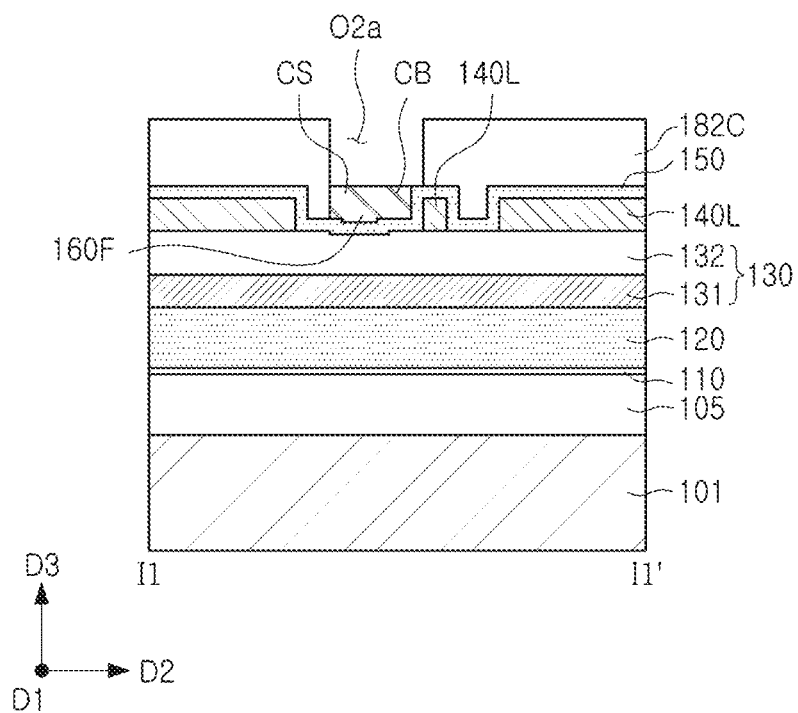

Referring to FIGS. 23A and 23B, a form in which the cut blocks are arranged side by side with the previously formed cut spacers CS in the second direction D2 is illustrated. This process may be understood with reference to the cut block forming process illustrated in FIGS. 9 to 11, except that the location of the cut block forming region is changed. The arrangement of the cut spacers and the cut blocks is illustrated as an example in a form in which adjacent wiring lines are separated by a dielectric pattern extending in the second direction.

Openings for adjacent cut spacers and cut blocks are formed, the gap-fill material layer 160 is filled through the openings of the mask pattern 182C, and the gap-fill material layer is etched back to reinforce the cut spacers CS together with the formation of the cut blocks CB. As illustrated in FIGS. 23A and 23B, the gap-fill material layer portion forming the cut block and the gap-fill material layer portion filling the concave portion of the cut spacer may be connected to each other.

Figure 24A:
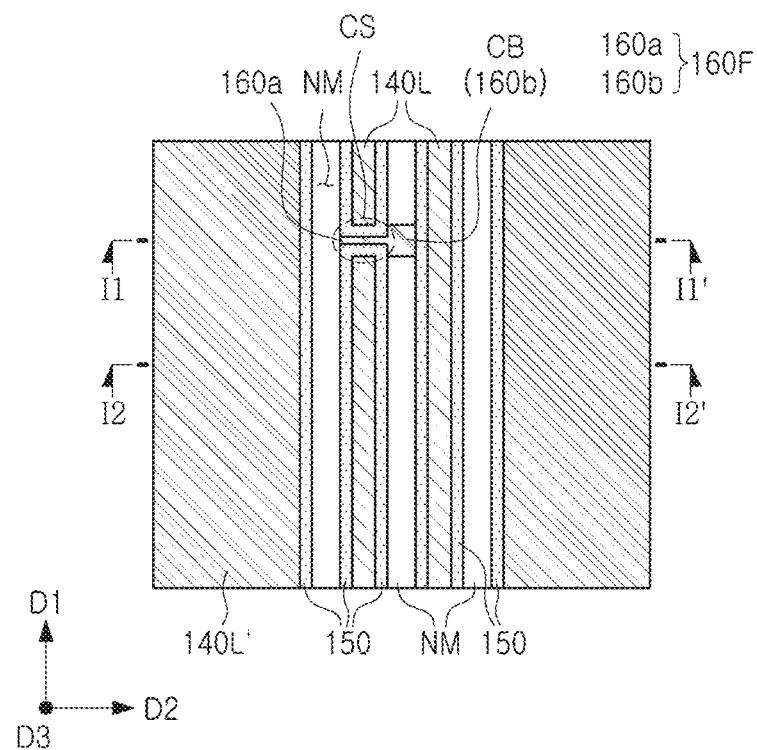
Figure 24B:
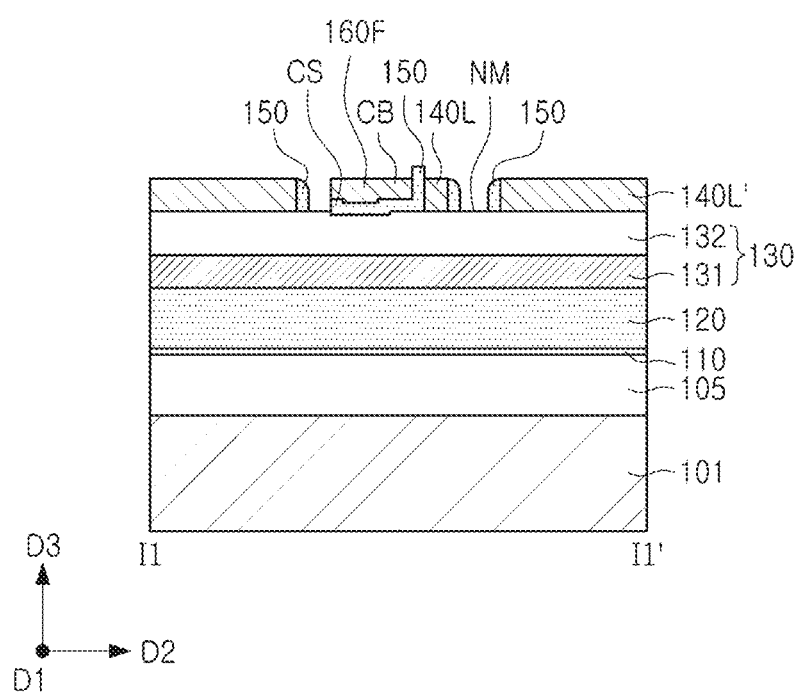
Figure 25A:
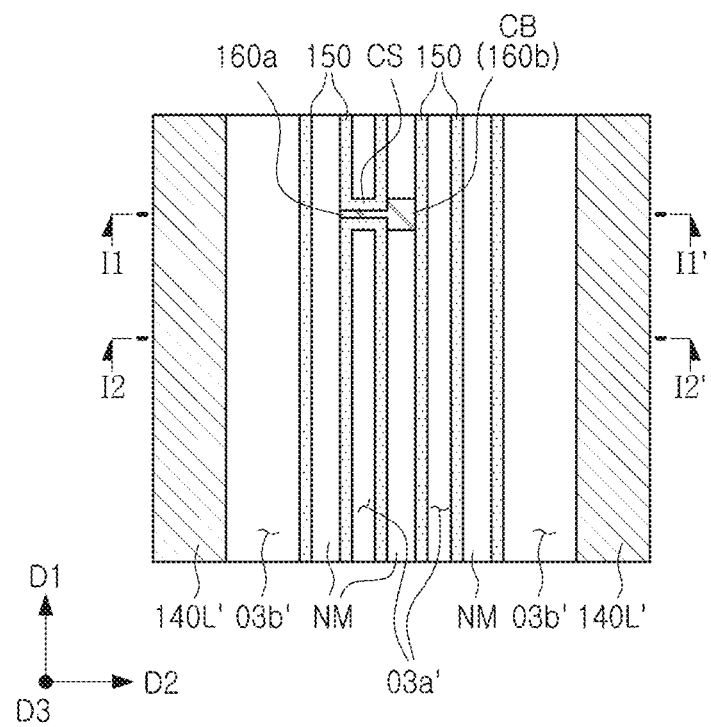
Figure 25B:
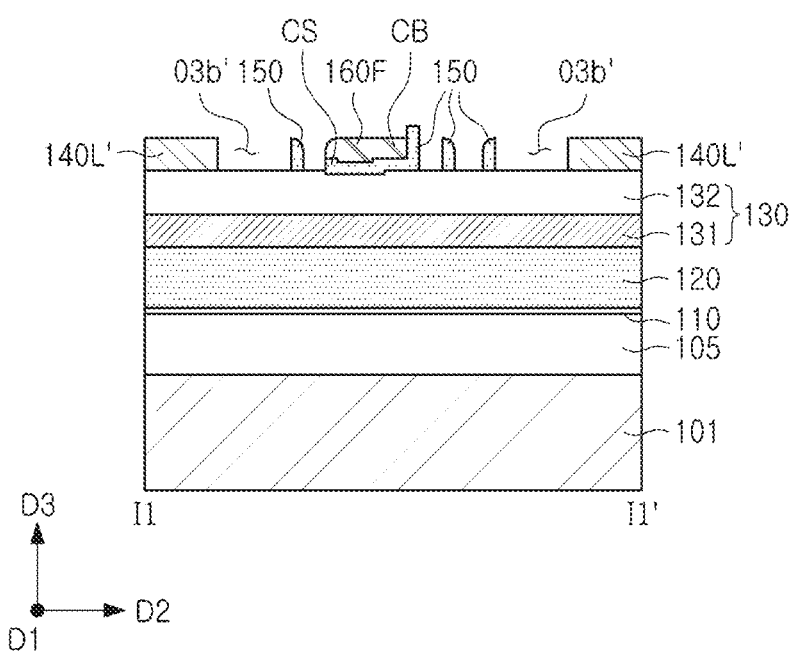

Referring to FIGS. 24A and 24B, the spacer material layer is etched back to form sidewall spacers 150 on respective sidewalls 140S of the plurality of mandrel lines 140L, and with reference to FIGS. 25A and 25B, by selectively removing the mandrel lines 140L using the mask stack pattern, a self-aligned pattern formed of the sidewall spacers 150 may be obtained (refer to FIGS. 15 and 16).

The sidewall spacers 150 obtained from this process are provided in a self-aligned pattern, and the cut spacers and cut blocks are respectively disposed in the first and second line spaces adjacent to each other on the left side, The cut spacers and the cut blocks may be disposed side by side in the second direction. As described above, the portion of the gap-fill material layer forming the cut block and the portion of the gap-fill material layer filling the recessed portion of the cut spacer may be connected to each other, to be provided as an integrated structure.

Figure 26A:
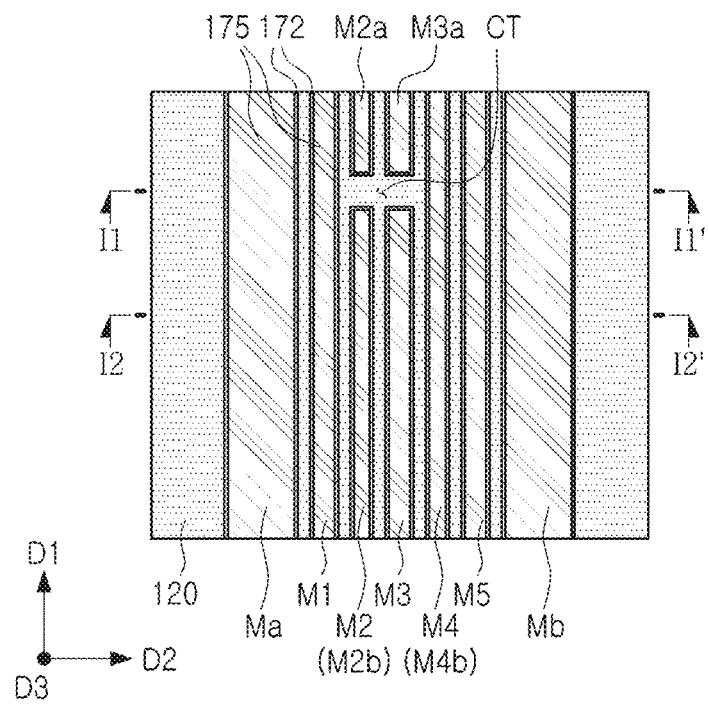
Figure 26B:
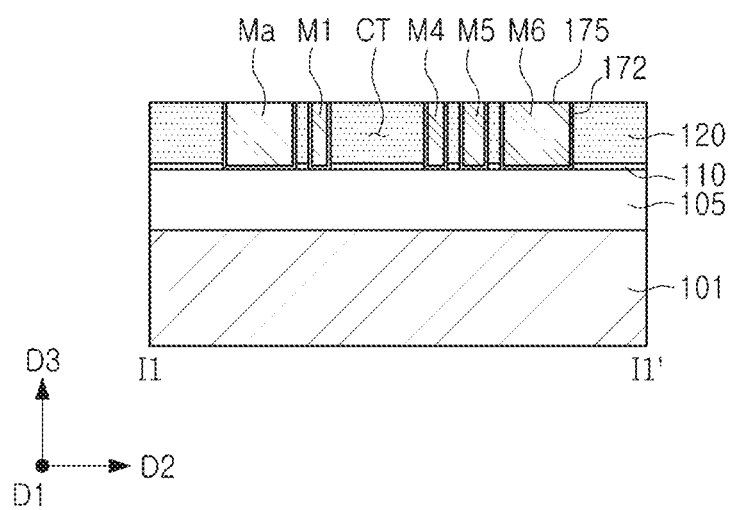

The second and first hard mask layers 132 and 131 are sequentially patterned using the cut spacer CS and the cut block CB together with the sidewall spacer 150, to form a mask pattern (see FIGS. 17 and 18), and a trench is formed in the dielectric layer 120 using a mask pattern (see FIG. 19). Next, as illustrated in FIGS. 26A and 26B, the conductive barrier 172 and the conductive layer 175 are sequentially formed in the first to third trenches OA1 ", OAT' and OB" of the dielectric layer 120, and a planarization process of the conductive layer 175 may be performed.

In this process, the first to fifth wiring lines M1, M2, M3, M4, and M5 and two peripheral wiring lines Ma and Mb may be formed in the dielectric layer 120. The first wiring line M1 may be divided into two wiring lines M1a and M1b by the first dielectric pattern CT1, and similarly, the second wiring line M2 may be divided into two wiring lines M2a and M2b by the second dielectric pattern CT2. The first and second dielectric patterns CT1 and CT2 may be positioned side by side in the second direction, and the first and second wiring lines may have line patterns separated in the same shape.

As set forth above, according to some example embodiments, a short circuit problem between metal lines to be formed in a subsequent process may be stably mitigated and/or prevented by reinforcing the spacer material layer portion (e.g., a cut spacer) located in the cut-off region of the mandrel area. Due to this reinforcing filling, unwanted opening of the cut spacer may not occur even in an etch-back process for forming the sidewall spacer.

While some example embodiments have been illustrated and described above, it will be apparent to those skilled in the art that modifications and variations could be made without departing from the scope of the present inventive concept as defined by the appended claims.

What is claimed is:

1. A method of fabricating a semiconductor device, comprising:
    forming a hard mask layer on a target layer;
    forming, on the hard mask layer, a plurality of mandrel lines each having sidewalls extending in a first direction and arranged in a second direction intersecting the first direction such that the plurality of mandrel lines define a non-mandrel area;
    forming a cut-off region in at least one of the plurality of mandrel lines;
    forming a spacer material layer such that the spacer material layer is conformally formed on the plurality of mandrel lines and the non-mandrel area and the spacer material layer includes a cut spacer in the cut-off region;
    depositing a gap-fill material such that the gap-fill material is formed on the cut spacer and the gap-fill material includes a cut block on a portion of the non-mandrel area;
    etching back the spacer material layer such that sidewall spacers are formed on the sidewalls of the plurality of mandrel lines and a region, except for the cut block, of upper surfaces of the plurality of mandrel lines and the non-mandrel area is exposed;
    selectively removing the plurality of mandrel lines from the sidewall spacers;
    using the cut spacer, the cut block, and the sidewall spacers to form a mask pattern by etching the hard mask layer; and
    etching the target layer using the mask pattern.

2. The method of claim 1, wherein
    the target layer includes a dielectric layer, and
    the etching of the target layer includes forming a plurality of trenches in the dielectric layer using the mask pattern.

3. The method of claim 2, further comprising:
    filling the plurality of trenches with a conductive material such that a plurality of wiring lines is formed in the plurality of trenches.

4. The method of claim 1, wherein a thickness of the spacer material layer is less than 50% of a width of the cut-off region in the first direction.

5. The method of claim 1, wherein a thickness of the spacer material layer is 10 nm or less.

6. The method of claim 1, wherein in a cross section in the first direction, the cut spacer has a concave portion.

7. The method of claim 6, wherein the concave portion of the cut spacer extends in the second direction.

8. The method of claim 6, wherein the depositing of the gap-fill material includes filling the concave portion of the cut spacer with the gap-fill material.

9. The method of claim 1, wherein
the depositing of the gap-fill material includes using a mask,
the mask including a first opening exposing the cut spacer and a second opening exposing the portion of the non-mandrel area on which the cut block is to be formed.

10. The method of claim 9, wherein the depositing of the gap-fill material includes an atomic layer deposition method.

11. The method of claim 1, wherein the spacer material layer and the gap-fill material include different materials.

12. A method of fabricating a semiconductor device, comprising:
forming a dielectric layer on a substrate;
forming a hard mask layer on the dielectric layer;
forming a plurality of mandrel lines on the hard mask layer such that the plurality of mandrel lines define a non-mandrel area;
forming a cut-off region in at least one of the plurality of mandrel lines;
forming a spacer material layer such that the spacer material layer is conformally formed on the plurality of mandrel lines and in the non-mandrel area, and the spacer material layer includes a cut spacer having a concave portion in the cut-off region;
depositing a gap-fill material such that the gap-fill material fills the concave portion of the cut spacer and the gap-fill material includes a cut block on a portion of the non-mandrel area;
etching back the spacer material layer such that sidewall spacers are formed on sidewalls of the plurality of mandrel lines, and a region, except for the cut block, of upper surfaces of the plurality of mandrel lines and the non-mandrel area is exposed;
selectively removing the plurality of mandrel lines from the sidewall spacers;
using the cut spacer, the cut block, and the sidewall spacers to form a mask pattern by etching the hard mask layer;
forming a plurality of trenches in the dielectric layer using the mask pattern; and
filling the plurality of trenches with a conductive material such that a plurality of wiring lines is formed in the plurality of trenches.

13. The method of claim 12, wherein
the sidewall spacers have a first interval defined by a width of the one of the plurality of mandrel lines and a second interval defined by a width of an exposed region of the non-mandrel area, and
the first interval and the second interval are equal to each other.

14. The method of claim 12, wherein the cut block is adjacent to the cut spacer in a direction in which the plurality of mandrel lines are arranged.

15. The method of claim 12, wherein
the spacer material layer includes titanium oxide, and
the gap-fill material includes silicon oxide.

16. The method of claim 12, wherein the hard mask layer includes a first hard mask layer including a first material and a second hard mask layer including a second material different from the first material.

17. The method of claim 16, wherein
the first material includes titanium nitride, and
the second material includes silicon oxide, silicon oxynitride, or silicon nitride.

18. The method of claim 12, wherein the plurality of mandrel lines includes amorphous silicon.

19. A method of fabricating a semiconductor device, comprising:
forming a hard mask layer on a target layer;
forming, on the hard mask layer, a plurality of mandrel lines each having sidewalls extending in a first direction and arranged in a second direction intersecting the first direction such that the plurality of mandrel lines define a non-mandrel area;
forming a cut-off region in at least one of the plurality of mandrel lines;
forming a spacer material layer such that the spacer material layer is conformally formed on the plurality of mandrel lines and the non-mandrel area and the spacer material layer includes a cut spacer having a concave portion in the cut-off region;
depositing a gap-fill material such that the gap-fill material fills the concave portion of the cut spacer, and the gap-fill material includes a cut block on a portion of the non-mandrel area, the cut block positioned adjacent to the cut spacer in the second direction;
etching back the spacer material layer such that sidewall spacers are formed on the sidewalls of the plurality of mandrel lines, respectively;
selectively removing the plurality of mandrel lines from the sidewall spacers;
using the cut spacer, the cut block, and the sidewall spacers to form a mask pattern by etching the hard mask layer; and
etching the target layer using the mask pattern.

20. The method of claim 19, wherein a gap-fill material portion of the cut block is connected to a gap-fill material portion of the cut spacer.

* * * * *